(12) United States Patent
Kim et al.

(10) Patent No.: US 10,345,405 B2
(45) Date of Patent: Jul. 9, 2019

(54) RADIOFREQUENCY COIL AND RADIOFREQUENCY COIL ASSEMBLY HAVING THE SAME

(71) Applicants: Samsung Electronics Co., Ltd., Suwon-si (KR); Samsung Life Public Welfare Foundation, Seoul (KR)

(72) Inventors: Kyoungnam Kim, Gunpo-si (KR); Yeon Hyeon Choe, Seoul (KR)

(73) Assignees: Samsung Electronics Co., Ltd., Suwon-si (KR); Samsung Life Public Welfare Foundation, Seoul (KR)

( * ) Notice: Subject to any disclaimer, the term of this patent is extended or adjusted under 35 U.S.C. 154(b) by 381 days.

(21) Appl. No.: 15/108,481

(22) PCT Filed: Dec. 26, 2014

(86) PCT No.: PCT/KR2014/012939
§ 371 (c)(1),
(2) Date: Jun. 27, 2016

(87) PCT Pub. No.: WO2015/099509
PCT Pub. Date: Jul. 2, 2015

(65) Prior Publication Data
US 2016/0320464 A1    Nov. 3, 2016

(30) Foreign Application Priority Data

Dec. 27, 2013 (KR) .................. 10-2013-0165672
Dec. 27, 2013 (KR) .................. 10-2013-0165677
(Continued)

(51) Int. Cl.
*G01R 33/34* (2006.01)
*G01R 33/36* (2006.01)
*G01R 33/3415* (2006.01)

(52) U.S. Cl.
CPC ....... *G01R 33/365* (2013.01); *G01R 33/3415* (2013.01); *G01R 33/34092* (2013.01); *G01R 33/3635* (2013.01)

(58) Field of Classification Search
CPC ............ G01R 33/365; G01R 33/34092; G01R 33/3415; G01R 33/3635; G01R 33/34084; G01R 33/341; G01R 33/34
(Continued)

(56) References Cited

U.S. PATENT DOCUMENTS 5,144,240 A    9/1992 Mehdizadeh et al.
6,348,794 B1 * 2/2002 Nabetani .............. G01R 33/365
                                                 324/322
(Continued)

FOREIGN PATENT DOCUMENTS

JP    2009-268898 A    11/2009
JP    2011-24685 A     2/2011
JP    4739915 B2       5/2011

OTHER PUBLICATIONS

Kenichi et al.; Translation of "Coil Unit, Magnetic Field Generator, and Magnetic Resonance Imaging Apparatus"; Feb. 10, 2011; EPO and Google (Year: 2011).*
(Continued)

*Primary Examiner* — Melissa J Koval
*Assistant Examiner* — Rahul Maini
(74) *Attorney, Agent, or Firm* — NSIP Law

(57) ABSTRACT

A radiofrequency (RF) coil for use in a magnetic resonance imaging (MRI) system using a plurality of RF coils includes a main loop coil including a plurality of electrical conductors, and an auxiliary loop coil disposed around the plurality of electrical conductors and including a plurality of electrical conductors.

14 Claims, 23 Drawing Sheets

(30) Foreign Application Priority Data

Dec. 27, 2013 (KR) ........................ 10-2013-0165680
Jan. 8, 2014 (KR) ........................ 10-2014-0002505

(58) Field of Classification Search
USPC ........................................................ 324/322
See application file for complete search history.

(56) References Cited

U.S. PATENT DOCUMENTS

| | | | |
|---|---|---|---|
| 6,879,159 B2 * | 4/2005 | Yoshida | G01R 33/365 |
| | | | 324/318 |
| 7,221,974 B1 * | 5/2007 | Su | G01R 33/34053 |
| | | | 324/318 |
| 7,386,338 B2 * | 6/2008 | Hoppel | G01R 33/3415 |
| | | | 324/318 |
| 7,560,934 B1 * | 7/2009 | Chmielewski | G01R 33/365 |
| | | | 324/318 |
| 7,605,588 B2 | 10/2009 | Gunamony | |
| 7,612,564 B1 | 11/2009 | Hardy et al. | |
| 7,663,367 B2 * | 2/2010 | Wiggins | G01R 33/34084 |
| | | | 324/318 |
| 8,013,606 B2 | 9/2011 | Leussler | |
| 8,193,811 B2 | 6/2012 | Tropp et al. | |
| 2004/0082848 A1 * | 4/2004 | Miyauchi | G01R 33/341 |
| | | | 600/422 |
| 2005/0253582 A1 | 11/2005 | Giaquinto et al. | |
| 2007/0159176 A1 | 7/2007 | Lanz et al. | |
| 2007/0279062 A1 | 12/2007 | Greim et al. | |
| 2010/0301862 A1 | 12/2010 | Tropp et al. | |
| 2011/0043209 A1 | 2/2011 | Zhu | |
| 2011/0121834 A1 | 5/2011 | Soutome et al. | |
| 2012/0286921 A1 | 11/2012 | Wang et al. | |
| 2013/0113485 A1 * | 5/2013 | Zhu | G01R 33/3415 |
| | | | 324/322 |

OTHER PUBLICATIONS

International Search Report dated Mar. 26, 2015 in counterpart International Application No. PCT/KR2014/012939 (3 pages in English; 4 pages in Korean).

* cited by examiner

RADIOFREQUENCY COIL AND RADIOFREQUENCY COIL ASSEMBLY HAVING THE SAME

CROSS REFERENCE TO RELATED APPLICATIONS

This application claims the benefit under 35 USC 119(a) of PCT Application No. PCT/KR2014/012939, filed on Dec. 26, 2014, which claims the benefit of Korean Patent Application Nos. 10-0165672 filed Dec. 27, 2013, 10-2013-0165677 filed Dec. 27, 2013, 10-2013-0165680 filed Dec. 27, 2013, and 10-2014-0002505 filed Jan. 8, 2014, in the Korean Intellectual Property Office, the entire disclosure of which is incorporated herein by reference for all purposes.

TECHNICAL FIELD

The present disclosure relates to radiofrequency (RF) coils and RF coil assemblies used in magnetic resonance imaging (MRI) apparatuses, and more particularly, to an RF coil that prevents occurrence of mutual inductance coupling, and an RF coil assembly including the RF coil.

BACKGROUND ART

FIG. 1 illustrates an example of a general magnetic resonance imaging (MRI) system, which is disclosed in U.S. Pat. No. 7,002,347. For convenience of explanation, the terms and reference numerals used in U.S. Pat. No. 7,002,347 are modified herein. The MRI system includes a magnet 1 generating a base magnetic field, a transmission radiofrequency (RF) coil 2 generating a magnetic field that renders hydrogen nuclei or the like of a patient 4 to enter an excited state, a reception RF coil 3 receiving an RF signal generated when the excited hydrogen nuclei or the like of the patient 4 returns to a ground state, and a table 5 for mounting the patient 4 thereon. The base magnetic field is generally referred to as a B0 field, and the magnetic field generated by the transmission RF coil 2 is generally referred to as a B1 field. The direction of the B0 field is a z-axis direction, and the direction of the B1 field is an x-axis or y-axis direction perpendicular to the B0 field. The transmission RF coil 2 not only generates the magnetic field but also receives the RF signal. The reception RF coil 3 may also generate the B1 field as necessary, as well as receiving the RF signal. Accordingly, unless specified otherwise below, the term "RF coil" is used as having both meanings of a transmitting RF coil and a receiving RF coil.

When a parallel image is particularly obtained by using an MRI system, an RF signal emitted from a patient of whom the parallel image is to be obtained is received via a plurality of RF coils. Since the plurality of RF coils are arranged adjacent to one another, mutual inductance coupling occurs between adjacent RF coils. Due to the mutual inductance coupling, a signal to noise ratio (SNR) of an MRI image degrades. When the RF coils are arranged with a predetermined interval between them in order to reduce mutual inductance coupling, reception of the MRI signal fails due to the interval between the RF coils.

Accordingly, it is important to prevent mutual inductance coupling between adjacent RF coils in order to improve the quality of an MRI image. Various decoupling methods have been developed to prevent mutual inductance coupling.

Prior art related to decoupling methods includes a plurality of patents, such as JP 2000-225106, U.S. Pat. No. 6,150,816, KR 0368890, U.S. Pat. No. 6,927,575, and 6,879,159.

FIG. 2 illustrates an example of a decoupling method using a preamplifier.

The example of FIG. 2 is described in JP 2000-225106, but the terms and reference numerals used in JP 2000-225106 are modified herein for convenience of explanation. An RF coil 6 and a preamplifier 10 are connected to each other via a circuit including an inductor 9. The RF coil 6 includes capacitors 7 and electrical conductors 8. The decoupling method illustrated in FIG. 2 uses a principle that the magnitude of a current flowing in an RF coil is proportional to the amount of mutual inductance coupling occurring between adjacent RF coils. In other words, the magnitude of a current flowing in the RF coil 6 is greatly reduced by greatly increasing an input impedance of the RF coil 6 by using the preamplifier 10 and the inductor 9, and thus mutual inductance coupling occurring between adjacent RF coils may be prevented.

FIG. 3 illustrates an example of a decoupling method in which a decoupling circuit is disposed between adjacent RF coils. The example of FIG. 3 is described in KR 0368890, and the terms and reference numerals used in KR 03688906 are modified herein for convenience of explanation. Three RF coils are arranged adjacent to one another, and are referred to as a first RF coil 20, a second RF coil 30, and a third RF coil 40, respectively. The first RF coil 20 includes capacitors 21 and electrical conductors 22. Similar to the first RF coil 20, each of the second RF coil 30 and the third RF coil 40 include capacitors and electrical conductors. A decoupling circuit 50 is disposed between the first RF coil 20 and the second RF coil 30, which are adjacent to each other. Similarly, a decoupling circuit 50 is disposed between the second RF coil 30 and the third RF coil 40, which are adjacent to each other. By disposing a decoupling circuit between adjacent RF coils as described above, mutual inductance coupling between the adjacent RF coils may also be prevented. The decoupling circuit may include capacitors 51 as shown in FIG. 3.

FIG. 4 illustrates an example of a structural decoupling method of a coil using overlapping between adjacent RF coils. The example of FIG. 4 is described in U.S. Pat. No. 6,879,159, and the terms and reference numerals used in U.S. Pat. No. 6,879,159 are modified herein for convenience of explanation. A first RF coil 60, a second RF coil 70, and a third RF coil 80 are disposed. The first RF coil 60 includes capacitors 61 and electrical conductors 62. Similar to the first RF coil 60, each of the second RF coil 70 and the third RF coil 80 include capacitors and electrical conductors. The first, second, and third RF coils 60, 70, and 80 are arranged such that adjacent RF coils overlap each other to form overlapping portions 90 and 91. The overlapping portions 90 and 91 may prevent mutual inductance coupling from occurring between the adjacent RF coils. In general, when RF coils are square shaped, it is efficient for the area of each of the overlapping portions 90 and 91 with respect to the overall area of adjacent RF coils to be about 14%. When RF coils are circular, it is efficient for the area of each of the overlapping portions 90 and 91 with respect to the overall area of adjacent RF coils to be about 22%.

FIG. 5 illustrates a decoupling method in an RF coil device that resonates at a plurality of frequencies, which is disclosed in U.S. Pat. No. 8,193,811. For convenience of explanation, the terms and reference numerals used in U.S. Pat. No. 8,193,811 are modified herein. In general, an MRI system measures a signal of hydrogen atomic nuclei included in water, fat, or the like. In detail, an RF coil resonates at a Lamor frequency of hydrogen atomic nuclei and obtains measurement information. However, in recent years, it is required to acquire both a signal of hydrogen atomic nuclei and a signal of atomic nuclei other than the hydrogen atomic nuclei. Accordingly, to simultaneously obtain signals of several atomic nuclei, a plurality of RF coils resonating at Lamor frequencies of the several atomic nuclei, respectively, are necessary. FIG. 5 shows RF coil structures 5000 each including two RF coils that simultaneously resonate at Lamor frequencies of two types of atomic nuclei. Each of the RF coil structures 5000 includes a first RF coil 5100 and a second RF coil 5200. In this case, a decoupling circuit 5300 is used to reduce mutual inductance coupling between adjacent RF coil structures.

However, in the decoupling methods described above with reference to FIGS. 3 and 5, an additional decoupling circuit needs to be disposed between adjacent RF coils. In the decoupling method described above with reference to FIG. 4, it is difficult to control a magnetic field generated in an overlap section due to the structural decoupling method using overlapping, and thus, acquiring a pure magnetic field derived from each coil is difficult. Moreover, an RF coil requires tuning in order to resonate at a specific frequency, but the decoupling method using the decoupling circuit or using overlapping affects a resonant frequency of an RF coil and thus, makes it difficult to achieve tuning.

DETAILED DESCRIPTION OF THE INVENTION

Technical Problem

The present disclosure provides a radiofrequency (RF) coil and an RF coil assembly used in magnetic resonance imaging (MRI) apparatuses. The technical problems to be solved by the present disclosure are not limited to the above technical problems, and other technical problems may be inferred from the following embodiments.

Technical Solution

This section provides a general summary of the disclosure and is not a comprehensive disclosure of its full scope or all of its features.

According to an aspect of the inventive concept, there is provided a radiofrequency (RF) coil for use in a magnetic resonance imaging (MRI) system, the RF coil including a main loop coil including a plurality of electrical conductors; and an auxiliary loop coil disposed around the plurality of electrical conductors and including a plurality of electrical conductors.

According to another aspect of the inventive concept, there is provided an RF coil assembly for use in an MRI system using a plurality of RF coils, the RF coil assembly including a first RF coil including a first main loop coil comprising a plurality of electrical conductors and a first auxiliary loop coil arranged outside the first main loop coil and including a plurality of electrical conductors; and a second RF coil disposed adjacent to the first RF coil and including a second main loop coil including a plurality of electrical conductors and a second auxiliary loop coil arranged outside the second main loop coil and including a plurality of electrical conductors, wherein the first auxiliary loop coil and the second auxiliary loop coil overlap each other.

According to another aspect of the inventive concept, there is provided an RF coil device for use in an MRI system, the RF coil device including a first RF coil structure including a first RF coil resonating at a first frequency and a second RF coil resonating at a second frequency; and a second RF coil structure located adjacent to the first RF coil structure and including a fourth RF coil resonating at the first frequency and a third RF coil resonating at the second frequency, wherein one of the second and third RF coils, resonating at the second frequency, is arranged between the first and fourth RF coils both resonating at the first frequency, in order to reduce mutual inductance coupling between the first and fourth RF coils.

According to another aspect of the inventive concept, there is provided an RF coil device for use in an MRI apparatus, the RF coil device including a first RF coil structure in which a first RF coil resonating at a first frequency and a second RF coil resonating at a second frequency are arranged side by side from left to right; and a second RF coil structure located adjacent to the first RF coil structure in a y-axis direction and in which a fourth RF coil resonating at the first frequency and a third RF coil resonating at the second frequency are arranged side by side from right to left.

According to another aspect of the inventive concept, there is provided an RF coil device for use in an MRI apparatus, the RF coil device including a first RF coil structure including N RF coils respectively resonating at N frequencies; and a second RF coil structure located adjacent to the first RF coil structure and including M RF coils respectively resonating at M frequencies, wherein an RF coil of the first RF coil structure that is closest to the second RF coil structure and an RF coil of the second RF coil structure that is closest to the first RF coil structure resonate at different frequencies.

According to another aspect of the inventive concept, there is provided an RF coil structure for use in an MRI system, the RF coil structure including an RF coil; an electrical conductor disposed around the RF coil to be apart from the RF coil; and an inductor that connects the RF coil to the electrical conductor.

According to another aspect of the inventive concept, there is provided an RF coil device for use in an MRI system using a plurality of RF coil structures, the RF coil device including a first RF coil structure including an RF coil, an electrical conductor disposed around the RF coil to be apart from the RF coil, and an inductor that connects the RF coil to the electrical conductor; and a second RF coil structure disposed adjacent to the first RF coil structure and including an RF coil, an electrical conductor disposed around the RF coil to be apart from the RF coil, and an inductor that connects the RF coil to the electrical conductor, wherein the electrical conductor of the first RF coil structure overlaps the electrical conductor of the second RF coil structure.

According to another aspect of the inventive concept, there is provided an RF coil for use in an MRI apparatus, the RF coil including an electrical conductor; and a wall integrally formed with the electrical conductor in order to reduce mutual inductance coupling with at least one RF coil adjacent to the RF coil.

According to another aspect of the inventive concept, there is provided an RF coil assembly for use in an MRI apparatus, the RF coil assembly including a first RF coil; a second RF coil; and a wall integrally formed with an electrical conductor in order to reduce mutual inductance coupling between the first and second RF coils, wherein at least one of the wall of the first RF coil and the wall of the second RF coil is positioned between the first RF coil and the second RF coil that are adjacent to each other.

Advantageous Effects

According to the present disclosure, mutual inductance coupling occurring between adjacent RF coils may be effectively reduced. In particular, a main loop coil independent from an overlap area for reducing mutual inductance coupling may receive an RF signal emitted from a patient without disturbance of the overlap area.

BEST MODE

A radiofrequency (RF) coil for use in a magnetic resonance imaging (MRI) system includes a main loop coil including a plurality of electrical conductors; and an auxiliary loop coil disposed around the plurality of electrical conductors and including a plurality of electrical conductors.

An RF coil device for use in an MRI system includes a first RF coil structure including a first RF coil resonating at a first frequency and a second RF coil resonating at a second frequency; and a second RF coil structure located adjacent to the first RF coil structure and including a fourth RF coil resonating at the first frequency and a third RF coil resonating at the second frequency, wherein one of the second and third RF coils, resonating at the second frequency, is arranged between the first and fourth RF coils both resonating at the first frequency, in order to reduce mutual inductance coupling between the first and fourth RF coils.

An RF coil structure for use in an MRI system includes an RF coil; an electrical conductor disposed around the RF coil to be apart from the RF coil; and an inductor that connects the RF coil to the electrical conductor.

An RF coil for use in an MRI apparatus includes an electrical conductor; and a wall integrally formed with the electrical conductor in order to reduce mutual inductance coupling with at least one RF coil adjacent to the RF coil.

Mode of the Invention

The present disclosure will now be described in detail with reference to the accompanying drawing(s).

Figure 6:
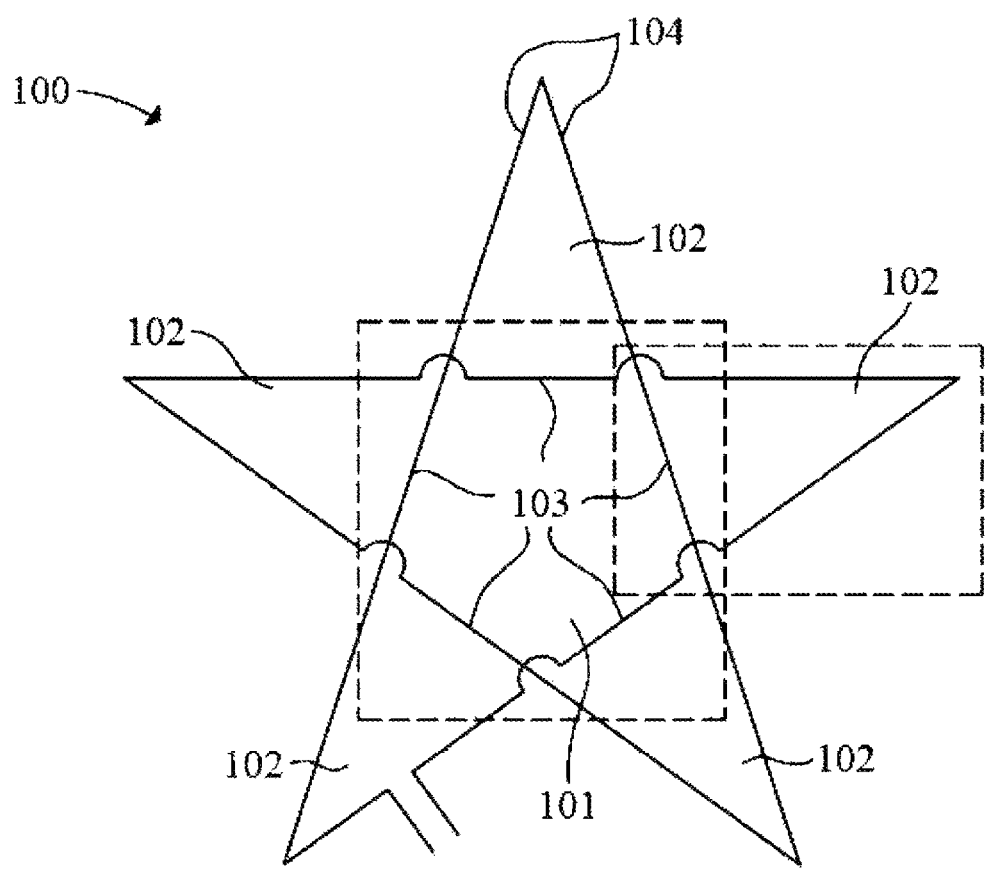
FIG. 6 is a view of an example of an RF coil according to the present disclosure.

FIG. 6 is a view of an example of a radiofrequency (RF) coil according to the present disclosure.

Figure 1:
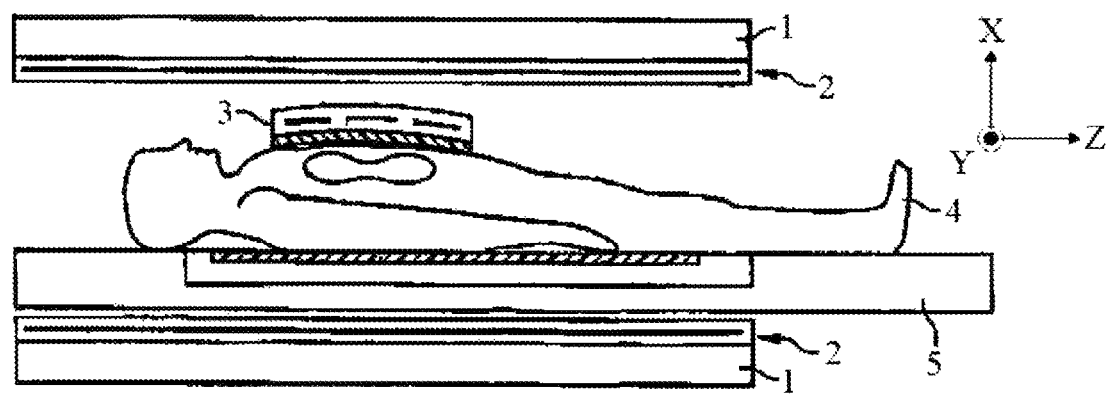
FIG. 1 illustrates an example of a general magnetic resonance imaging (MRI) system.

An RF coil 100 according to the present disclosure includes a main loop coil 101 and an auxiliary loop coil 102. The main loop coil 101 is within a dotted quadrilateral and has a pentagonal shape, and the auxiliary loop coil 102 is within a dotted quadrilateral and has a triangular shape outside the main loop coil 101. The auxiliary loop coil 102 is connected in series with the main loop coil 101, and 5auxiliary loop coils 102 are included. The main loop coil 101 and the auxiliary loop coil 102 include a plurality of electrical conductors 103 and a plurality of electrical conductors 104. The auxiliary loop coils 102 share some of the electrical conductors of the main loop coil 101. For convenience of explanation, capacitors included in an RF coil are omitted, and only electrical conductors are shown. The main loop coil 101 and the auxiliary loop coils 102 are on the same plane unless an external force is exerted. For example, when the RF coil 100 according to the present disclosure is disposed at the location of the reception RF coil 3 of FIG. 1, the main loop coil 101 and the auxiliary loop coils 102 are on the same plane except when an external force is exerted, such as when the RF coil 100 is bent along a surface curve of the patient 4.

Figure 7:
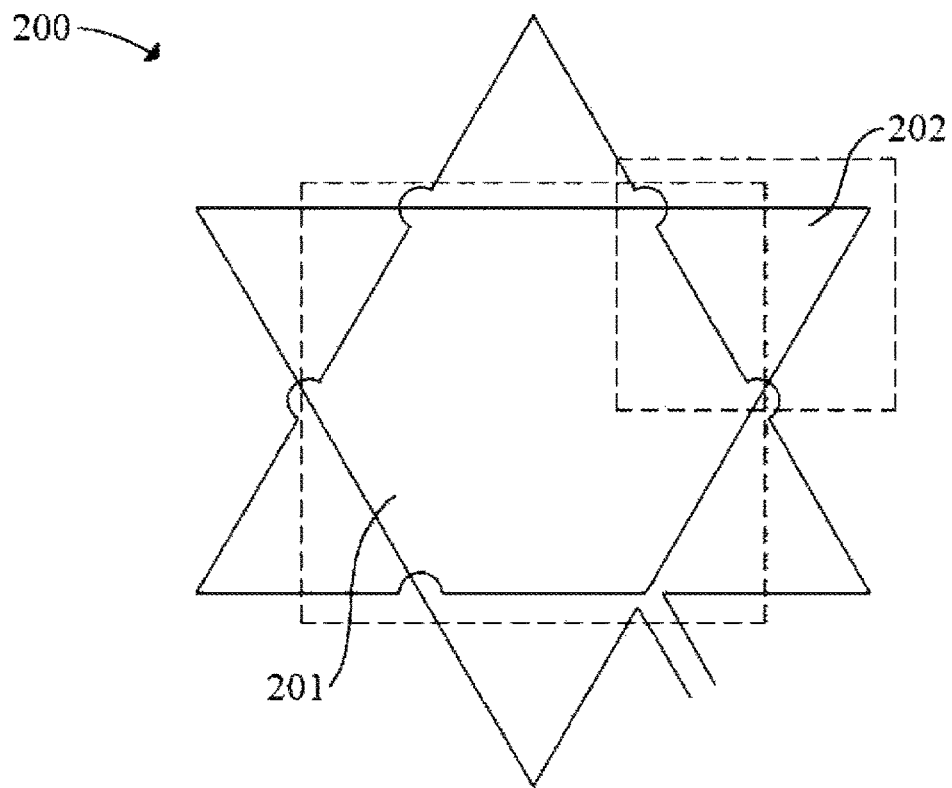
FIG. 7 is a view of another example of an RF coil according to the present disclosure.

FIG. 7 is a view of another example of an RF coil according to the present disclosure.

An RF coil 200 according to the present disclosure includes a main loop coil 201 and auxiliary loop coils 202. The main loop coil 201 has a hexagonal shape, and 6 auxiliary loop coils 202 are formed outside the main loop coil 201 and each have a triangular shape. The shape of the main loop coil 201 is associated with the number of auxiliary loop coils 202. Although not shown in FIG. 7, when there are 7 auxiliary loop coils, a main loop coil may have a heptagonal shape. However, the shape of the main loop coil is not important. The present disclosure is arranging 5 or more auxiliary loop coils outside a main loop coil and connecting the 5 or more auxiliary loop coils in series with the main loop coil, wherein each loop coil is defined by a plurality of electrical conductors. Accordingly, mentioning the shape of a main loop coil in FIGS. 6 and 7 is to distinguish a main loop coil from an auxiliary loop coil, and this does not limit the scope of the present disclosure.

Figure 8:
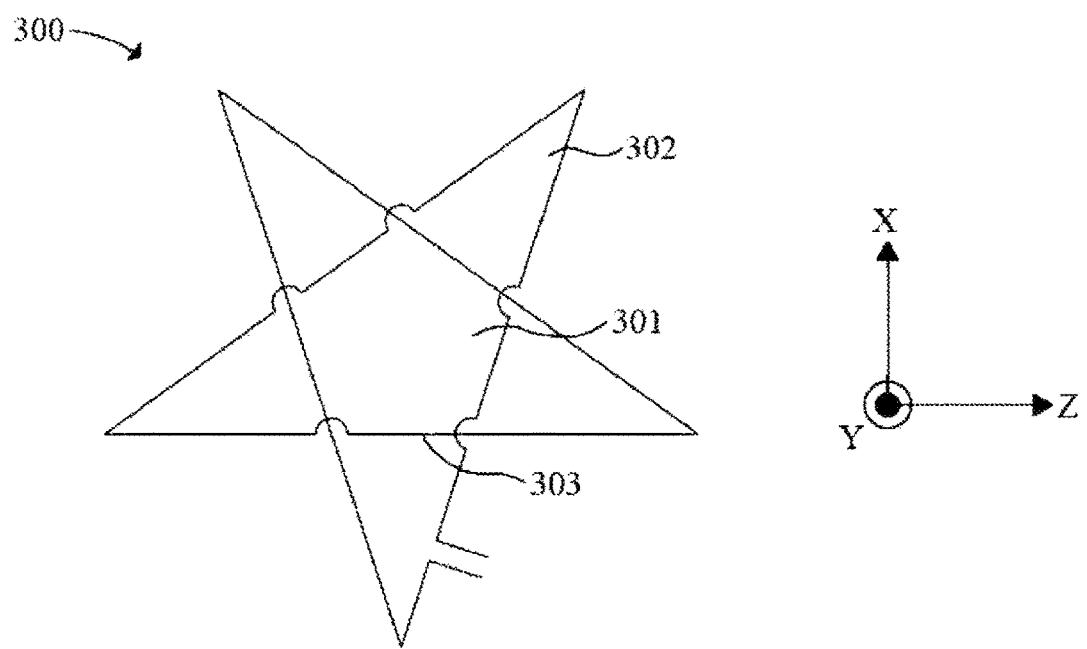
FIG. 8 is a view of another example of an RF coil according to the present disclosure.

FIG. 8 is a view of another example of an RF coil according to the present disclosure.

An RF coil 300 according to the present disclosure includes a main loop coil 301 and auxiliary loop coils 302. For convenience of explanation, 5 auxiliary loop coils 302 are illustrated. At least one of a plurality of electrical conductors that surround the main loop coil 301 is parallel to a z axis which is a base magnetic field direction. As well known to one of ordinary skill in the art, an electrical conductor parallel to a base magnetic field direction from among the electrical conductors of an RF coil usually receives an RF signal emitted from a patient. In FIG. 8, one electrical conductor 303 is parallel to the base magnetic field direction.

Figure 9:
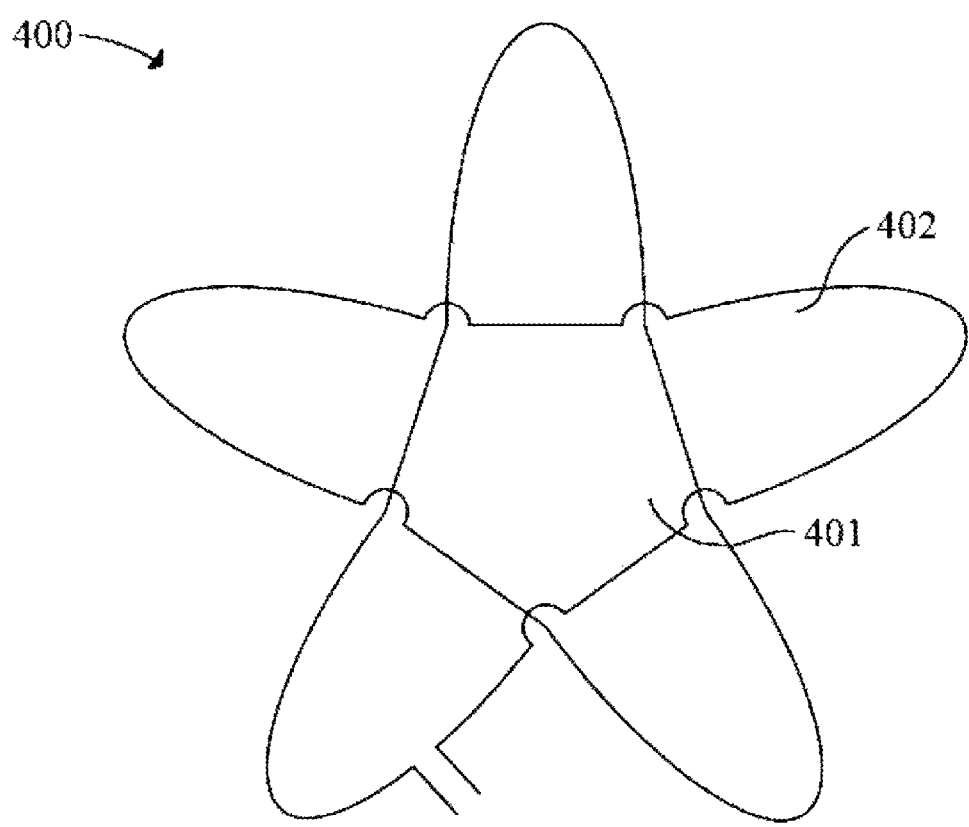
FIG. 9 is a view of another example of an RF coil according to the present disclosure.

FIG. 9 is a view of another example of an RF coil according to the present disclosure.

An RF coil 400 according to the present disclosure includes a main loop coil 401 and auxiliary loop coils 402. For convenience of explanation, 5 auxiliary loop coils 402 are illustrated. Each auxiliary loop coil 402 has a convex shape. The convex shape is preferably a semicircle. An auxiliary loop coil has a triangular shape in FIGS. 7 and 8, and has a convex shape in FIG. 9. As such, the shape of an auxiliary loop coil may vary as necessary. For example, when an overlap area is formed only by overlapping auxiliary loop coils when using an RF coil according to the present disclosure as shown in FIG. 10, the shape of the auxiliary loop coil may be changed to enlarge the overlap area.

Figure 10:
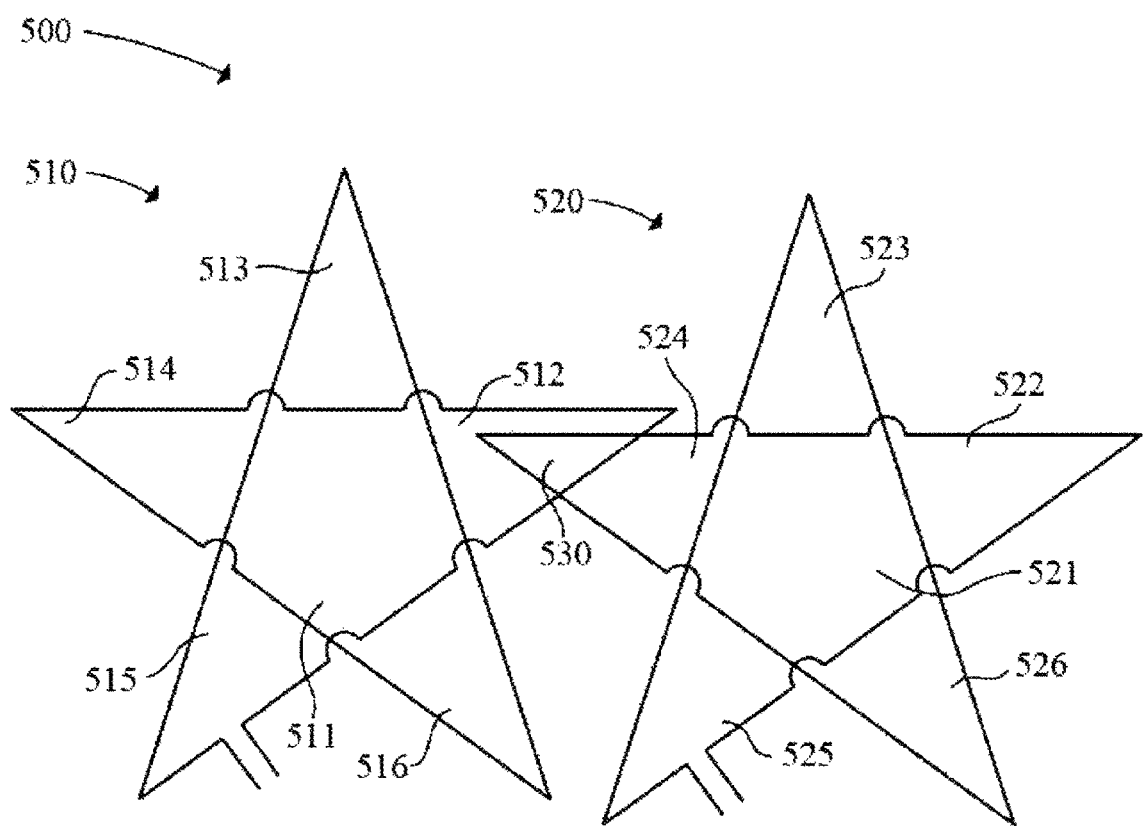
FIG. 10 illustrates an example of an RF coil assembly using an RF coil according to the present disclosure.

FIG. 10 illustrates an example of an RF coil assembly using an RF coil according to the present disclosure.

An RF coil assembly 500 according to the present disclosure includes a first RF coil 510 and a second RF coil 520. The first RF coil 510 includes a first main loop coil 511 including a plurality of electrical conductors and first auxiliary loop coils 512, 513, 514, 515, and 516 arranged outside the first main loop coil 511 and including a plurality of electrical conductors. The second RF coil 520 is disposed adjacent to the first RF coil 510 and includes a second main loop coil 521 including a plurality of electrical conductors and second auxiliary loop coils 522, 523, 524, 525, and 526 arranged outside the second main loop coil 521 and including a plurality of electrical conductors. Mutual inductance coupling occurs between the first RF coil 510 and the second RF coil 520, which are adjacent to each other, but is reduced via an overlap area 530 formed by the first auxiliary loop coil 512 of the first RF coil 510 and the second auxiliary loop coil 524 of the second RF coil 520. In particular, the first auxiliary loop coil 512 and the second auxiliary loop coil 524 form the overlap area 530 such that the overlap area 530 is apart by a certain distance from each of the first main loop coil 511 and the second main loop coil 521. Accordingly, each of the main loop coils 511 and 521 is independent from the overlap area 530 for reducing mutual inductance coupling and thus may obtain a pure RF signal. An overlap area may be formed in each of the first auxiliary loop coils 512, 513, 514, 515, and 516. Accordingly, 5 adjacent RF coils are arranged around the single first RF coil 510, and thus more RF coils may be arranged adjacent to one another than when conventional rectangular RF coils are used. Thus, reception of an RF signal may improve.

Figure 11:
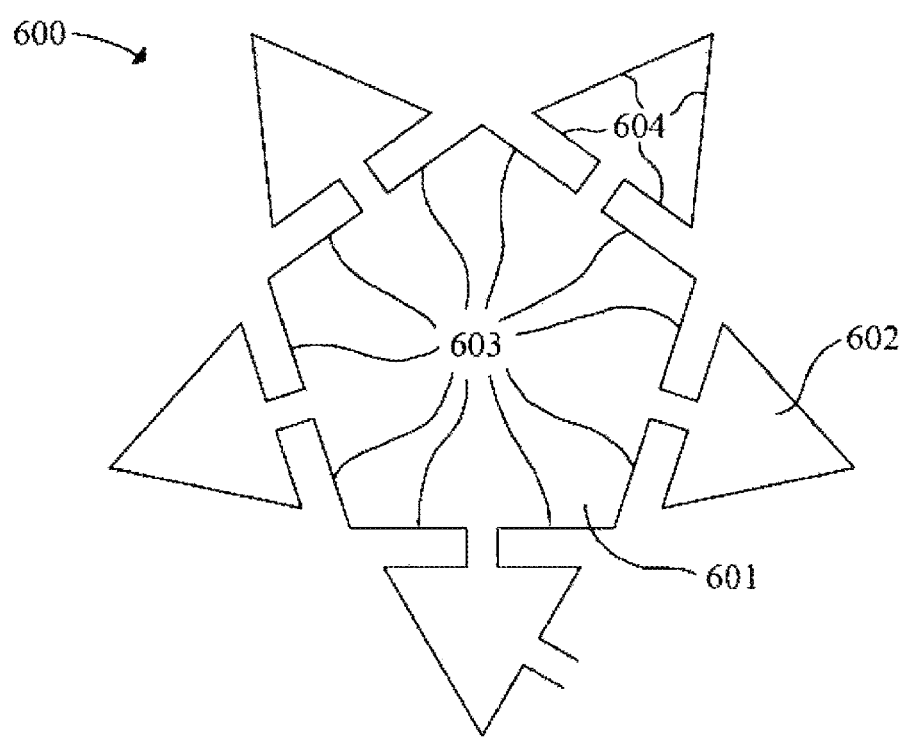
FIG. 11 is a view of another example of an RF coil according to the present disclosure.

FIG. 11 illustrates another example of an RF coil according to the present disclosure.

An RF coil 600 according to the present disclosure includes a main loop coil 601 including a plurality of electrical conductors 603, and auxiliary loop coils 602 each including a plurality of electrical conductors 604. 5 auxiliary loop coils 602 are arranged around the main loop coil 601. The auxiliary loop coils 602 are connected in series with the main loop coil 601. The main loop coil 601 and the auxiliary loop coils 602 are on the same plane. However, in contrast with the RF coils 100, 200, 300, and 400 disclosed in FIGS. 6-9, the auxiliary loop coils 602 do not share the electrical conductors of the main loop coil 601.

Various embodiments according to the present disclosure will now be described as follows:

(1) an RF coil for use in an MRI system using a plurality of RF coils, the RF coil including a main loop coil including a plurality of electrical conductors; and an auxiliary loop coil arranged around the main loop coil and including a plurality of electrical conductors;

(2) the RF coil including 5 or more auxiliary loop coils;

(3) the RF coil in which the main loop coil and the auxiliary loop coil are connected in series with each other;

(4) the RF coil in which the main loop coil includes at least one electrical conductor that is parallel to a base magnetic field direction;

(5) the RF coil in which the auxiliary loop coil has a convex shape;

(6) the RF coil in which the convex shape of the auxiliary loop coil is a semicircle;

(7) the RF coil in which the main loop coil and the auxiliary loop coil are on the same plane;

(8) the RF coil in which the auxiliary loop coil shares some of the electrical conductors of the main loop coil;

(9) an RF coil assembly for use in an MRI system using a plurality of RF coils, the RF coil assembly including a first RF coil including a first main loop coil including a plurality of electrical conductors and a first auxiliary loop coil arranged outside the first main loop coil and including a plurality of electrical conductors; and a second RF coil disposed adjacent to the first RF coil and including a second main loop coil including a plurality of electrical conductors and a second auxiliary loop coil arranged outside the second main loop coil and including a plurality of electrical conductors, wherein the first auxiliary loop coil and the second auxiliary loop coil overlap each other;

(10) the RF coil assembly in which the first auxiliary loop coil and the second main loop coil are apart a certain distance from each other and the second auxiliary loop coil and the first main loop coil are apart a certain distance from each other;

(11) the RF coil assembly in which the number of at least one of the first auxiliary loop coil and the second auxiliary loop coil is 5 or more;

(12) the RF coil assembly in which the first auxiliary loop coil is connected in series with the first main loop coil and the second auxiliary loop coil is connected in series with the second main loop coil;

(13) the RF coil assembly in which at least one of the first auxiliary loop coil and the second auxiliary loop coil includes at least one electrical connector that is parallel to a base magnetic field direction;

(14) the RF coil assembly in which at least one of the first auxiliary loop coil and the second auxiliary loop coil has a convex shape;

(15) the RF coil assembly in which the convex shape is a semicircle;

(16) the RF coil assembly in which the first main loop coil and the first auxiliary loop coil are on the same plane;

(17) the RF coil assembly in which the second main loop coil and the second auxiliary loop coil are on the same plane; and

(18) the RF coil assembly in which the first auxiliary loop coil shares some of the electrical conductors of the first main loop coil.

According to the present disclosure, mutual inductance coupling occurring between adjacent RF coils may be effectively reduced. In particular, a main loop coil independent from an overlap area for reducing mutual inductance coupling may receive an RF signal emitted from a patient without disturbance of the overlap area.

Figure 12:
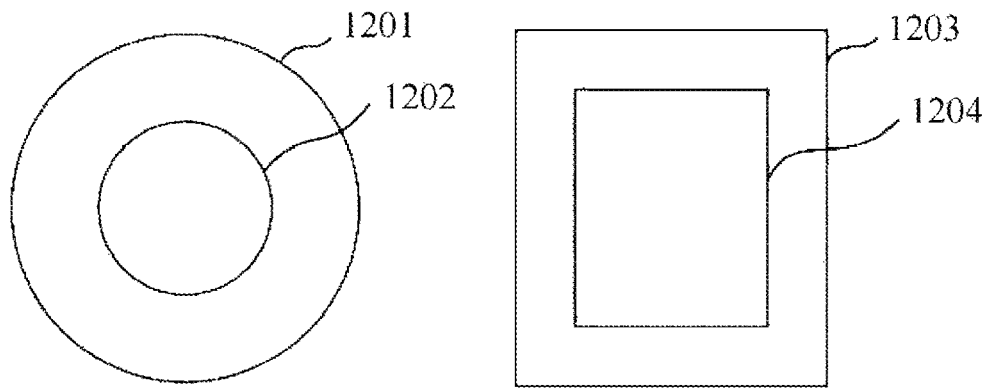
FIG. 12 illustrates an example of an RF coil structure that resonates at Lamor frequencies of two types of atomic nuclei.
Figure 12:
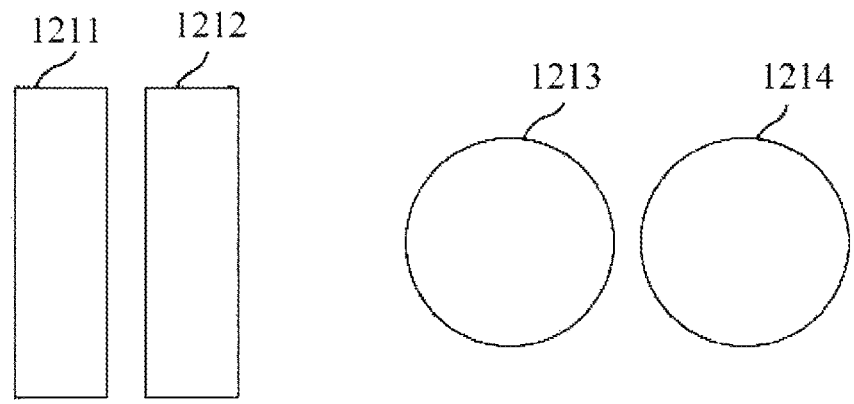

FIG. 12 illustrates an example of an RF coil structure that resonates at Lamor frequencies of two types of atomic nuclei.

Figure 2:
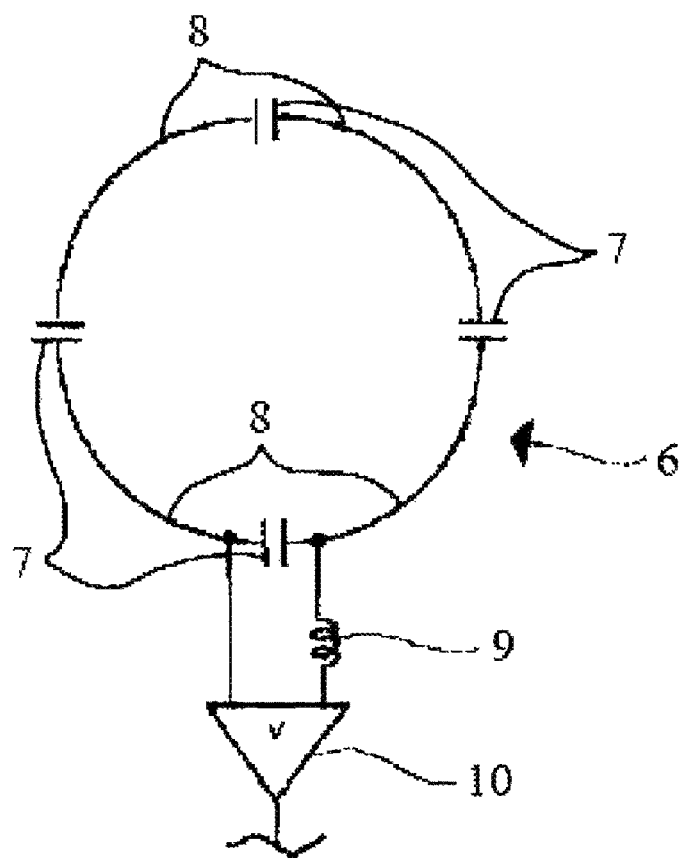
FIG. 2 illustrates an example of a decoupling method using a preamplifier.
Figure 3:
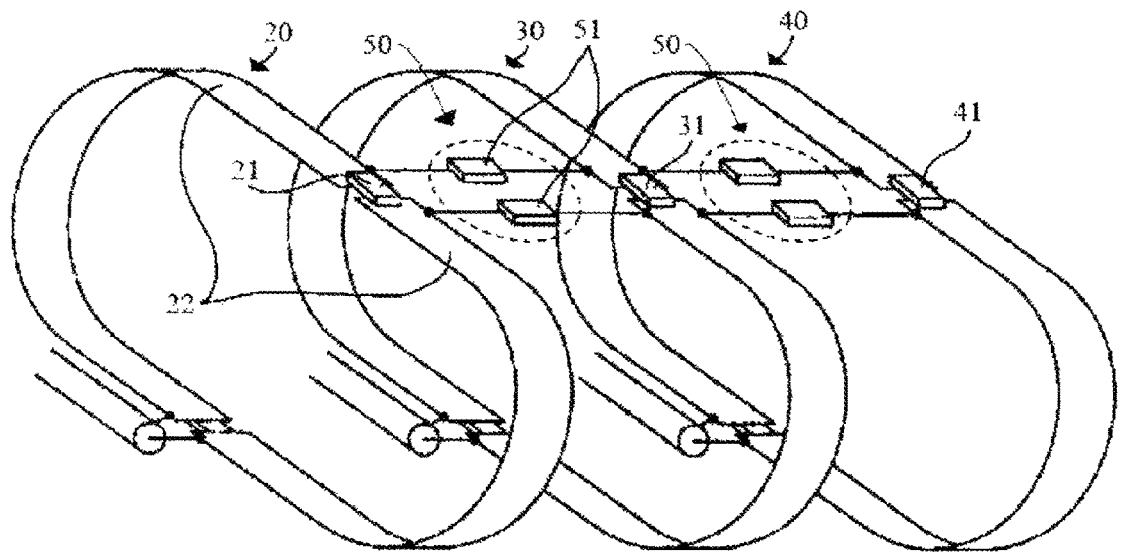
FIG. 3 illustrates an example of a decoupling method in which a decoupling circuit is disposed between adjacent radiofrequency (RF) coils.
Figure 4:
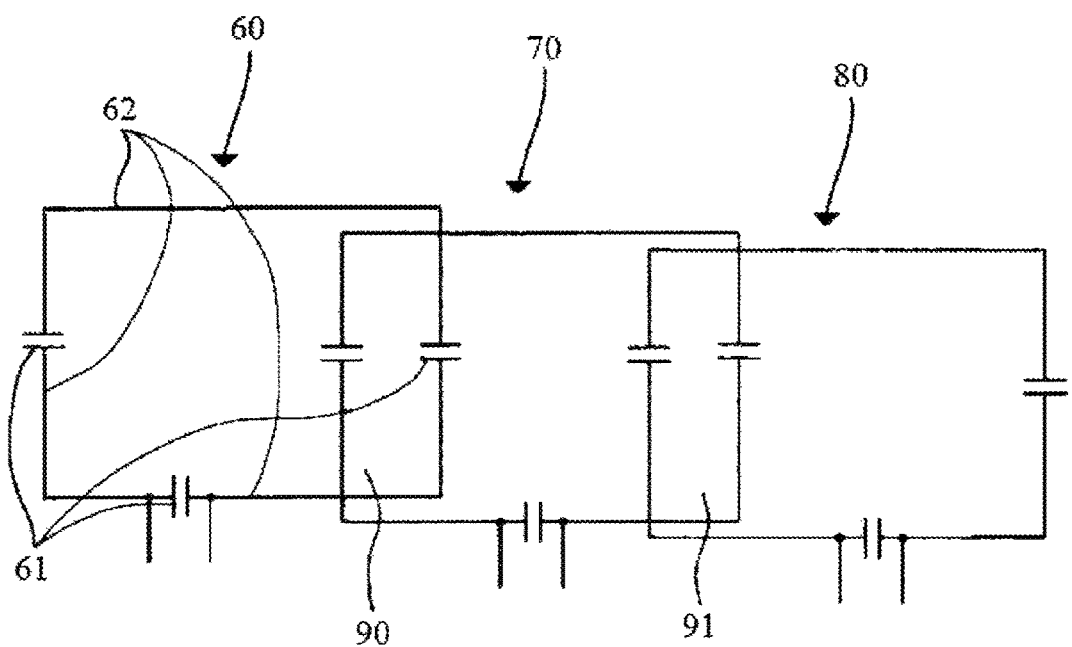
FIG. 4 illustrates an example of a decoupling method using overlapping between adjacent RF coils.
Figure 5:
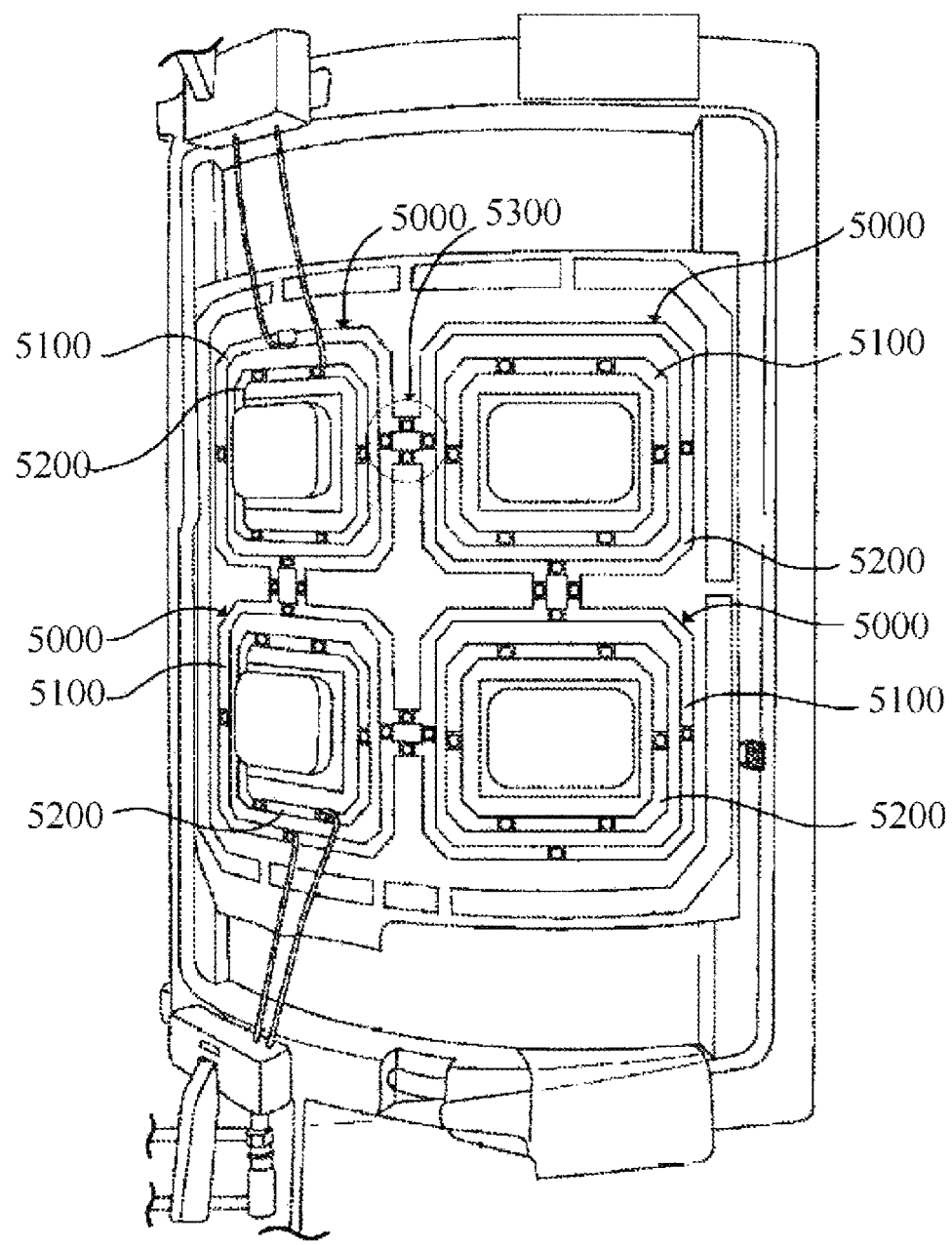
FIG. 5 illustrates a decoupling method in an RF coil system that resonates at a plurality of frequencies, which is disclosed in U.S. Pat. No. 8,193,811.

To construct the RF coil structure that resonates at Lamor frequencies of two types of atomic nuclei, one RF coil may be constructed to resonate at two types of frequencies. However, in general, different RF coils are provided to resonate at different frequencies. FIG. 12 shows RF coil structures 1200 and 1210 each including two RF coils that respectively resonate at two types of atomic nucleus Lamor frequencies. The RF coils include capacitors and electrical conductors as shown in FIGS. 2, 3, and 4. However, for convenience of explanation, FIG. 12 illustrates only an electrical conductor by using a line, and FIGS. 13-16 also illustrate only an electrical conductor by using a line without illustrating capacitors. To construct the RF coil structure 1200 including two RF coils resonating at different frequencies, RF coils 1202 and 1204 are arranged within RF coils 1201 and 1203, respectively. To construct the RF coil structure 1210 including two RF coils resonating at different frequencies, RF coils 1211 and 1212 are arranged side by side from left to right, and RF coils 1213 and 1214 are arranged side by side from left to right. Although not shown in FIG. 12, RF coils may be arranged up and down. Although the RF coils that constitute the RF coil structures 1200 and 1210 are only the circular RF coils 1201, 1202, 1213, and 1214 and the quadrilateral RF coils 1203, 1204, 1211, and 1212 in FIG. 12, RF coils of various shapes, such as an oval, a triangle, and a pentagon, may constitute the RF coil structures 1200 and 1210.

Figure 13:
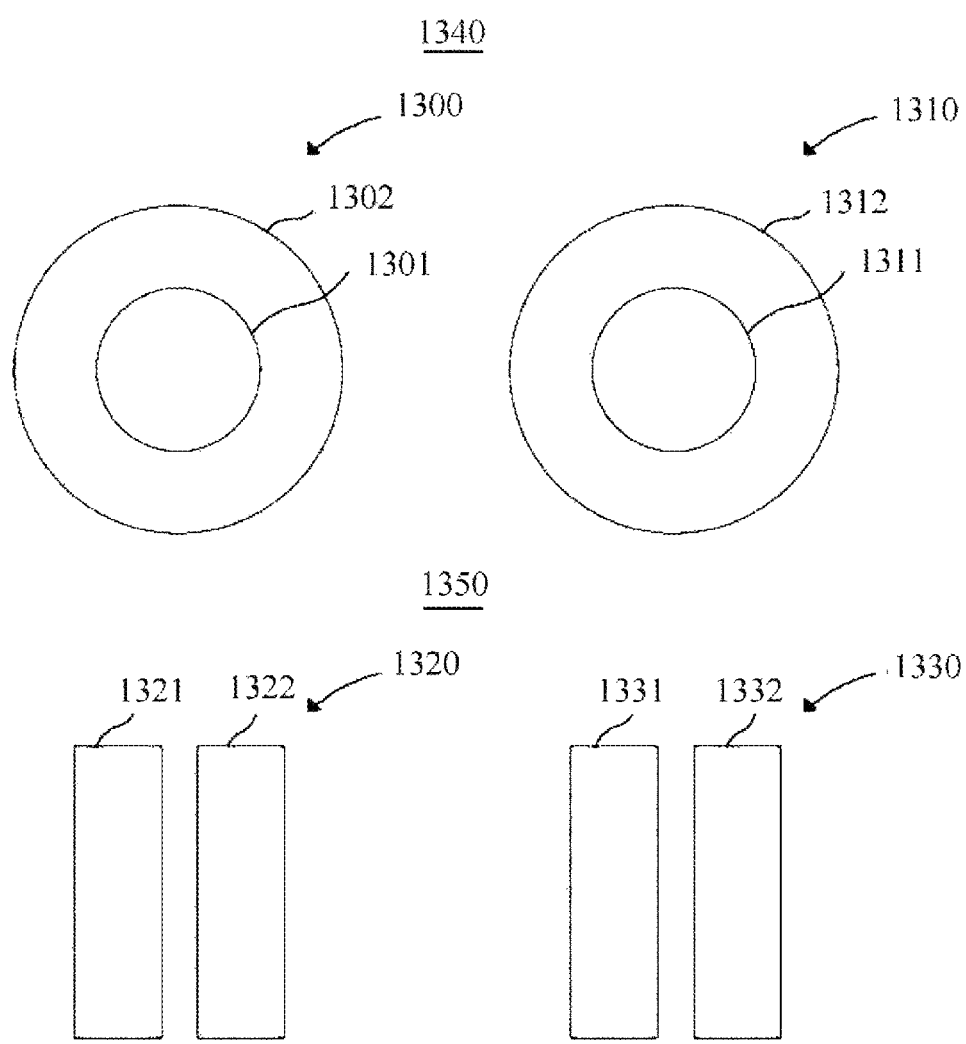
FIG. 13 illustrates an example of an RF coil device according to the present disclosure.

FIG. 13 illustrates an example of an RF coil device according to the present disclosure.

A plurality of RF coil structures that resonate at two or more types of atomic nucleus Lamor frequencies may be arranged to construct an RF coil device. FIG. 13 shows an RF coil device 1340 constructed by arranging RF coil structures 1300 and 1310, in each of which one of two RF coils that respectively resonate at two types of atomic nucleus Lamor frequencies is arranged inside the other, according to the present disclosure. In more detail, the RF coil device 1340 of FIG. 13 includes a first RF coil structure 1300 including a first RF coil 1301 resonating at a first frequency and a second RF coil 1302 resonating at a second frequency, and a second RF coil structure 1310 disposed adjacent to the first RF coil structure 1300 and including a fourth RF coil 1312 resonating at the first frequency and a third RF coil 1311 resonating at the second frequency. The second RF coil 1302, resonating at the second frequency, is arranged between the first RF coil 1301 and the fourth RF coil 1312, both resonating at the first frequency, in order to reduce mutual inductance coupling between the first RF coil 1301 and the fourth RF coil 1312. Although not shown in FIG. 13, even when the third RF coil 1311 is disposed between the first RF coil 1301 and the fourth RF coil 1312, mutual inductance coupling may be reduced. In other words, according to the present disclosure, to prevent RF coils resonating at the same frequency from being adjacent to each other, an RF coil resonating at a different frequency is disposed between the RF coils resonating at the same frequency. The same method is equally applied to an RF coil device 1350 including a fifth RF coil structure 1320 including a fifth RF coil 1321 resonating at the first frequency and a sixth RF coil 1322 resonating at the second frequency, and a sixth RF coil structure 1330 disposed adjacent to the fifth RF coil structure 1320 and including a seventh RF coil 1331 resonating at the first frequency and an eighth RF coil 1332 resonating at the second frequency. Thus, the sixth RF coil 1322 is disposed between the fifth RF coil 1321 and the seventh RF coil 1331.

Figure 14:
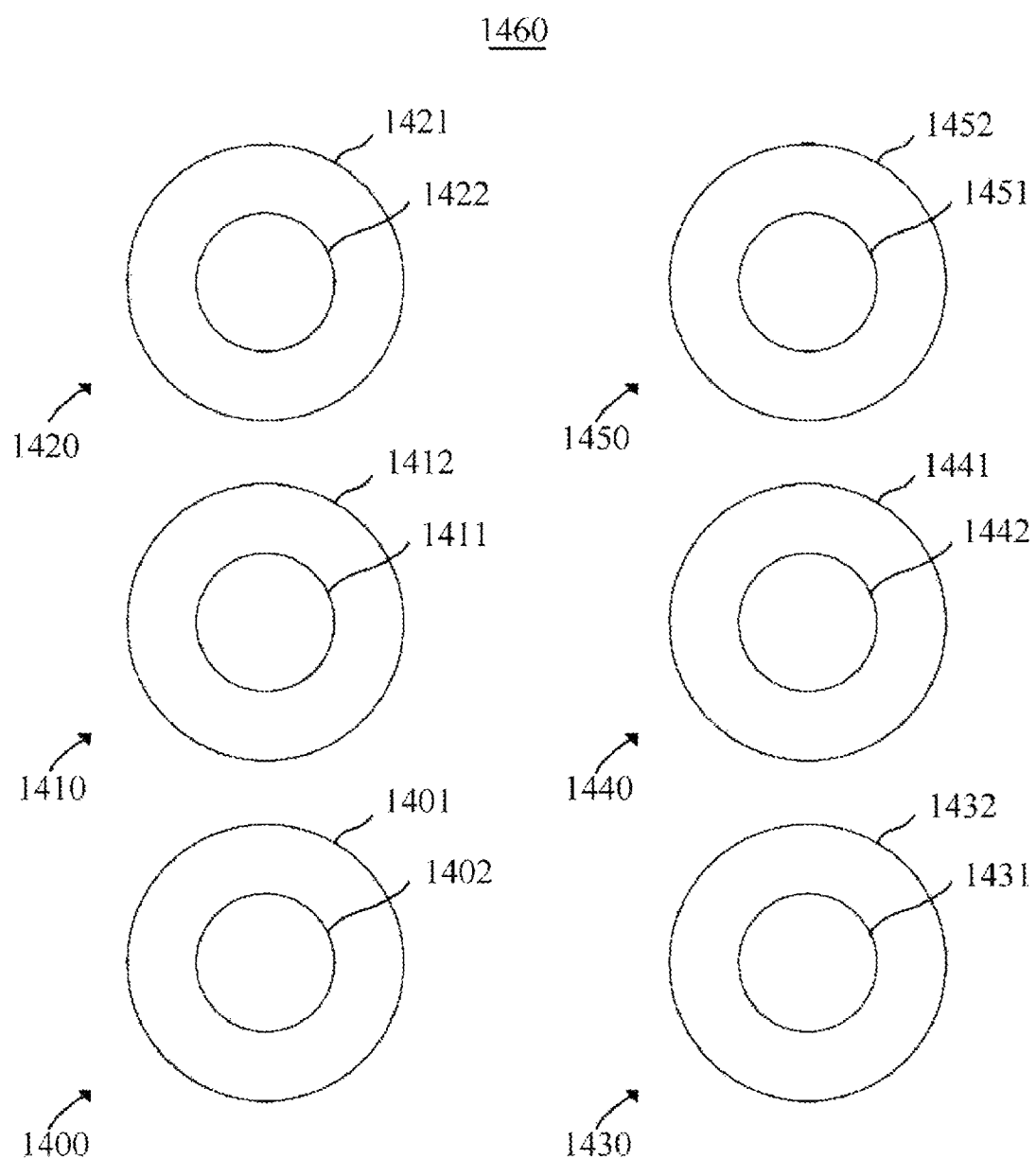
FIG. 14 illustrates another example of an RF coil device according to the present disclosure.

FIG. 14 illustrates another example of an RF coil device according to the present disclosure.

FIG. 13 shows the RF coil devices 1340 and 1350 each including two RF coil structures. FIG. 14 shows an RF coil device 1460 including six RF coil structures. RF coil structures 1400, 1410, 1420, 1430, 1440, and 1450 include RF coils 1401, 1411, 1421, 1431, 1441, and 1451 resonating at a first frequency, and RF coils 1402, 1412, 1422, 1432, 1442, and 1452 resonating at a second frequency, respectively. As shown in FIG. 14, an RF coil resonating at the second frequency is disposed between RF coils resonating at the first frequency in every two adjacent RF coil structures, and thus mutual inductance coupling between the every two adjacent RF coil structures is reduced. Although the 6 RF coil structures are illustrated in FIG. 14, an RF coil device including N RF coils structures may also reduce mutual inductance coupling between adjacent RF coil structures according to the same method as the method of FIG. 14.

Figure 15:
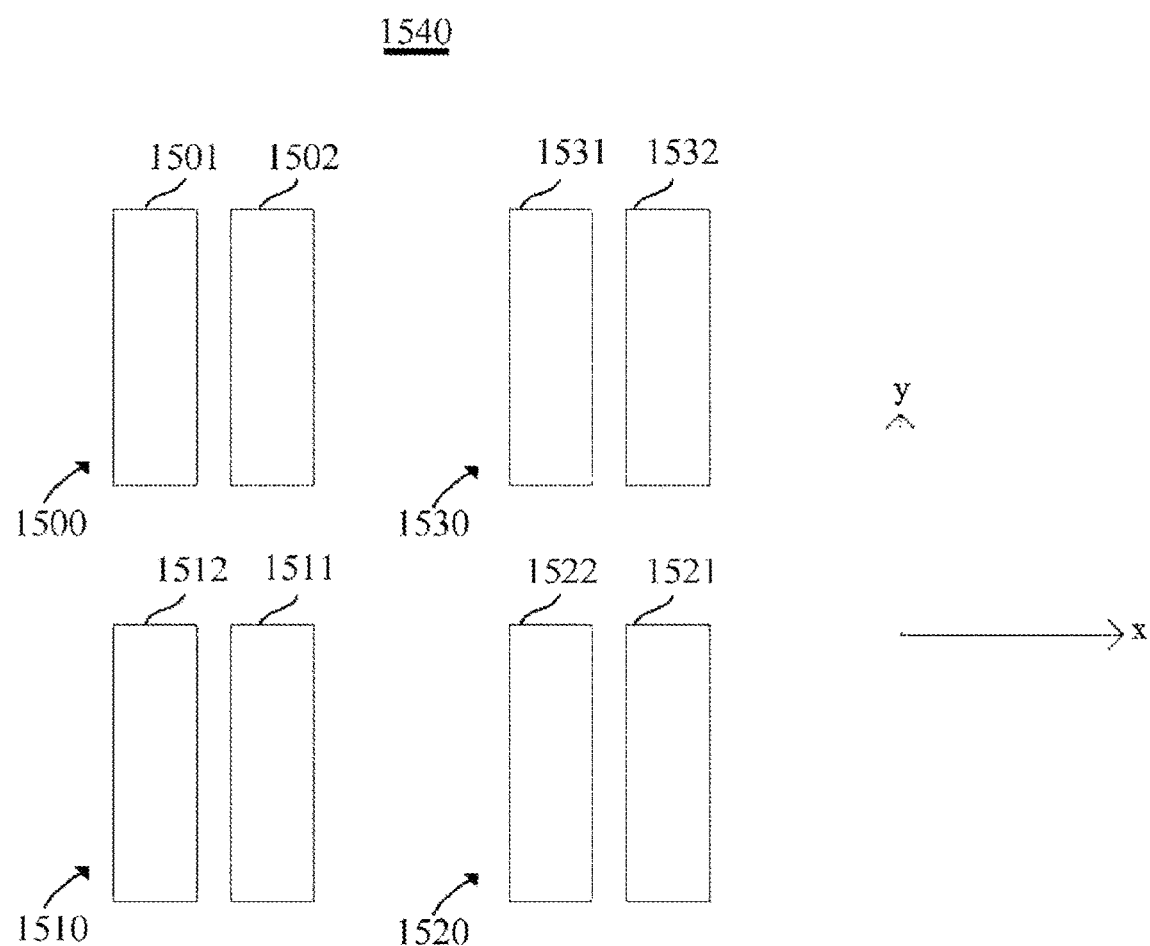
FIG. 15 illustrates another example of an RF coil device according to the present disclosure.

FIG. 15 illustrates another example of an RF coil device according to the present disclosure.

FIG. 15 illustrates an RF coil device 1540 including RF coil structures 1500, 1510, 1520, and 1530 each including two RF coils that resonate at Lamor frequencies of two types of atomic nuclei and are arranged side by side from left to right. In more detail, the RF coil device 1540 of FIG. 15 includes RF coil structures 1500, 1510, 1520, and 1530 including RF coils 1501, 1511, 1521, and 1531 resonating at a first frequency, and RF coils 1502, 1512, 1522, and 1532 resonating at a second frequency, respectively. In the two RF coil structures 1500 and 1530 adjacent to each other in an x-axis direction, the RF coil 1502 resonating at the second frequency is disposed between the RF coils 1501 and 1531 resonating at the first frequency in order to reduce mutual inductance coupling between the two adjacent RF coil structures 1500 and 1530. In the two RF coil structures 1510 and 1520 adjacent to each other in the x-axis direction, mutual inductance coupling is also reduced according to the same method. However, in the two RF coil structures 1500 and 1510 adjacent to each other in a y-axis direction, RF coils resonating at the same frequency are arranged diagonally in order to prevent the RF coils resonating at the same frequency to be adjacent to each other, thereby reducing mutual inductance coupling. In other words, when the first RF coil 1501 resonating at the first frequency and the second RF coil 1502 resonating at the second frequency are arranged side by side from left to right in the first RF coil structure 1500, the second RF coil structure 1510 adjacent to the first RF coil structure 1500 in the y-axis direction includes the fourth RF coil 1511 resonating at the first frequency and the third RF coil 1512 resonating at the second frequency arranged side by side from right to left, thereby reducing mutual inductance coupling occurring between adjacent RF coil structures. The same method is equally applied to the RF coil structures 1520 and 1530 adjacent to each other in the y-axis direction, and thus mutual inductance coupling therebetween is reduced.

Figure 16:
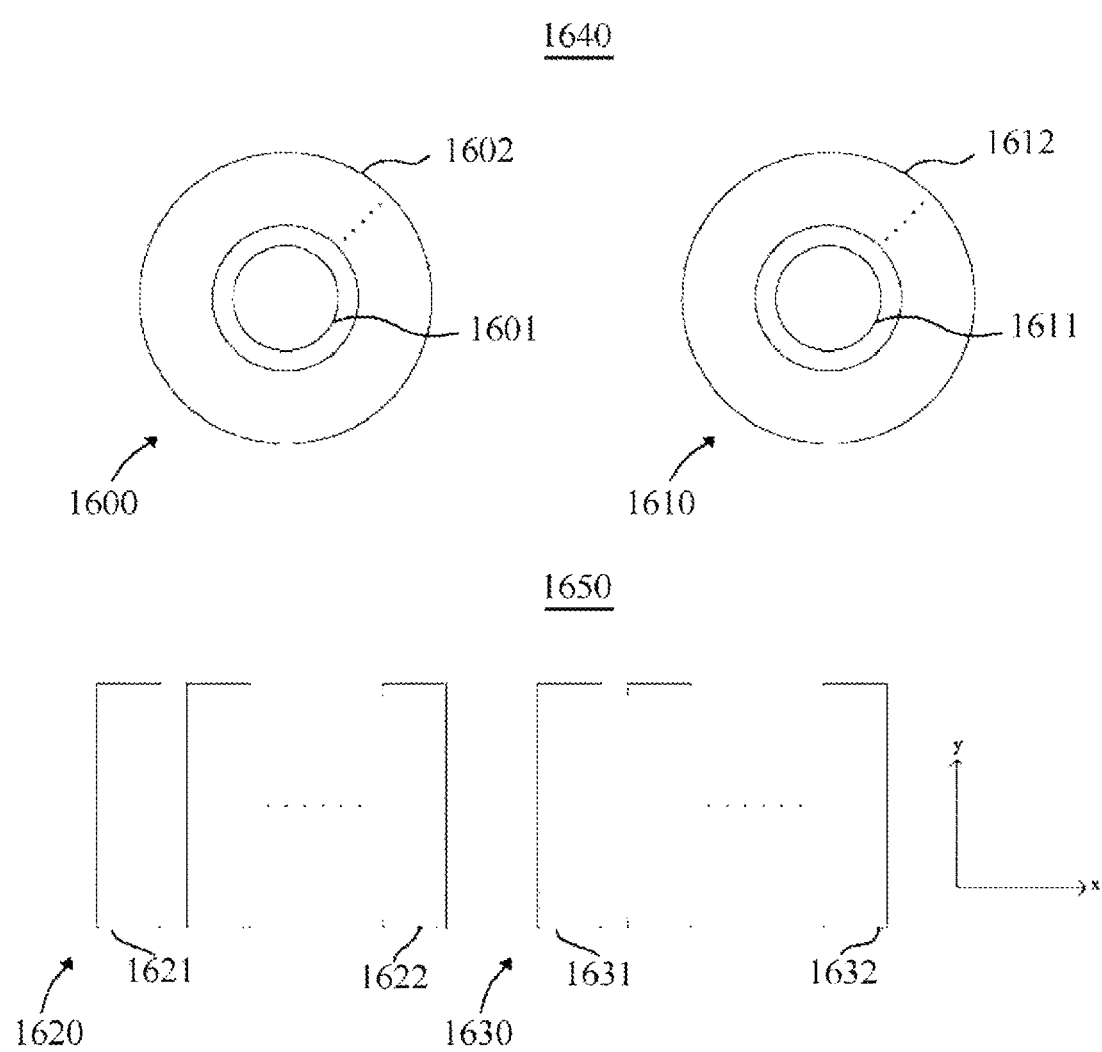
FIG. 16 illustrates another example of an RF coil device according to the present disclosure.

FIG. 16 illustrates another example of an RF coil device according to the present disclosure.

RF coil structures each including two RF coils that respectively resonate at two types of atomic nucleus Lamor frequencies, and an RF coil device constructed by arranging the RF coil structures according to the present disclosure have been described above. FIG. 16 illustrates RF coil devices 1640 and 1650 including RF coil structures 1600, 1610, 1620, and 1630 each resonating at two or more types of atomic nucleus Lamor frequencies. The first RF coil structure 1600 of the RF coil device 1640 includes N RF coils that respectively resonate N types of atomic nucleus Lamor frequencies. The second RF coil structure 1610 adjacent to the first RF coil structure 1600 includes M RF coils that respectively resonate M types of atomic nucleus Lamor frequencies. In the N RF coils of the first RF coil structure 1600, (N-2) RF coils are arranged between an innermost RF coil 1601 and an outermost RF coil 1602. In the M RF coils of the second RF coil structure 1610, (M-2) RF coils are arranged between an innermost RF coil 1611 and an outermost RF coil 1612. In this case, in the RF coil device 1640, RF coils resonating at different frequencies are arranged as the RF coil 1602 of the first RF coil structure 1600, which is closest to the second RF coil structure 1610, and the RF coil 1612 of the second RF coil structure 1610, which is closest to the first RF coil structure 1600. The third RF coil structure 1620 of the RF coil device 1650 includes N RF coils that respectively resonate N types of atomic nucleus Lamor frequencies. The fourth RF coil structure 1630 adjacent to the third RF coil structure 1620 includes M RF coils that respectively resonate M types of atomic nucleus Lamor frequencies. The RF coil structures 1620 and 1630 may include N RF coils arranged side by side in the x-axis or y-axis direction and M RF coils arranged side by side in the x-axis or y-axis direction, respectively. FIG. 16 illustrates only an arrangement of RF coils in the x-axis direction. Also, in this case, in the RF coil device 1650, RF coils resonating at different frequencies are arranged as an RF coil 1622 of the third RF coil structure 1620, which is closest to the fourth RF coil structure 1630, and an RF coil 1632 of the fourth RF coil structure 1630, which is closest to the third RF coil structure 1620.

Various embodiments according to the present disclosure will now be described as follows:

(19) an RF coil device for use in an MRI system, the RF coil device including a first RF coil structure including a first RF coil resonating at a first frequency and a second RF coil resonating at a second frequency; and a second RF coil structure located adjacent to the first RF coil structure and including a fourth RF coil resonating at the first frequency and a third RF coil resonating at the second frequency, wherein one of the second and third RF coils, resonating at the second frequency, is arranged between the first and fourth RF coils both resonating at the first frequency, in order to reduce mutual inductance coupling between the first and fourth RF coils;

(20) the RF coil device in which one of the first frequency and the second frequency is a Lamor frequency for hydrogen atomic nuclei;

(21) the RF coil device in which the first RF coil is disposed inside the second RF coil in the first RF coil structure and the third RF coil is disposed inside the fourth RF coil in the second RF coil structure;

(22) the RF coil device in which the first and second RF coils of the first RF coil structure are disposed side by side from left to right and the fourth and third RF coils of the second RF coil structure are disposed side by side from left to right;

(23) an RF coil device for use in an MRI system, the RF coil device including a first RF coil structure in which a first RF coil resonating at a first frequency and a second RF coil resonating at a second frequency are arranged side by side from left to right; and a second RF coil structure located adjacent to the first RF coil structure in the y-axis direction and in which a fourth RF coil resonating at the first frequency and a third RF coil resonating at the second frequency are arranged side by side from right to left;

(24) the RF coil device in which one of the first frequency and the second frequency is a Lamor frequency for hydrogen atomic nuclei;

(25) an RF coil device for use in an MRI system, the RF coil device including a first RF coil structure including N RF coils respectively resonating N frequencies; and a second RF coil structure located adjacent to the first RF coil structure and including M RF coils respectively resonating at M frequencies, wherein an RF coil of the first RF coil structure that is closest to the second RF coil structure and an RF coil of the second RF coil structure that is closest to the first RF coil structure resonate at different frequencies;

(26) the RF coil device in which one of the N frequencies is a Lamor frequency of hydrogen atomic nuclei and one of the M frequencies is also a Lamor frequency of hydrogen atomic nuclei;

(27) the RF coil device in which (N-1) RF coils among the N RF coils of the first RF coil structure are arranged inside one RF coil;

(28) the RF coil device in which (M-1) RF coils among the M RF coils of the second RF coil structure are arranged inside one RF coil;

(29) the RF coil device in which (N-1) RF coils among the N RF coils of the first RF coil structure are arranged inside one RF coil and at the same time (M-1) RF coils among the M RF coils of the second RF coil structure are arranged inside one RF coil;

(30) the RF coil device in which the N RF coils of the first RF coil structure are arranged side by side in the x-axis direction;

(31) the RF coil device in which the M RF coils of the second RF coil structure are arranged side by side in the x-axis direction; and

(32) the RF coil device in which the N RF coils of the first RF coil structure are arranged side by side in the x-axis direction and at the same time the M RF coils of the second RF coil structure are arranged side by side in the x-axis direction.

According to the present disclosure, RF coil structures each including RF coils resonating at different frequencies are arranged adjacent to each other, and thus mutual inductance coupling between the adjacent RF coil structures may be reduced without using a special decoupling method.

Figure 17:
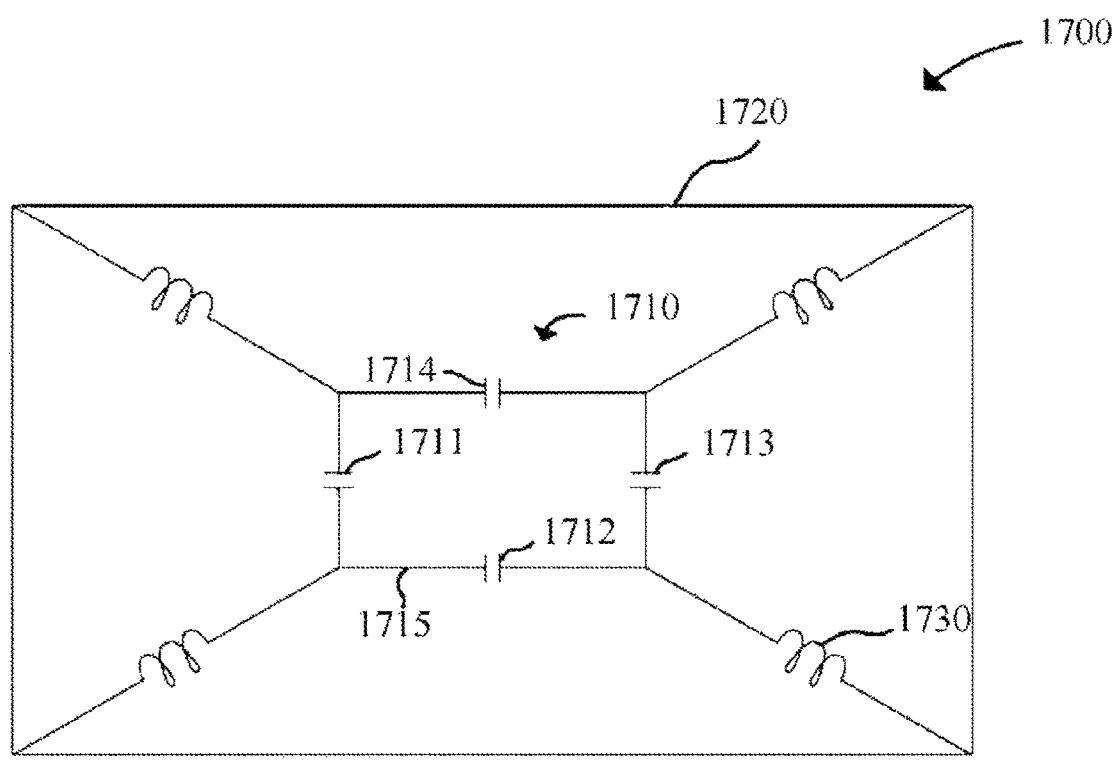
FIG. 17 illustrates an example of an RF coil structure according to the present disclosure.

FIG. 17 illustrates an example of an RF coil structure 1700 according to the present disclosure.

The RF coil structure 1700 includes an RF coil 1710, an electrical conductor 1720 disposed outside the RF coil 1710, and an inductor 1730 connecting the RF coil 1710 to the electrical conductor 1720. The electrical conductor 1720 may include a capacitor and/or a conductor such as an inductor. The RF coil 1710 includes capacitors 1711, 1712, 1713, and 1714 and an electrical conductor 1715 connecting the capacitors 1711, 1712, 1713, and 1714 to one another. The number of capacitors included in the RF coil 1710 may be variously set. According to the present disclosure, for example, the 4 capacitors 1711, 1712, 1713, and 1714 constitute the RF coil 1710. When the inductor 1730, which connects the RF coil 1710 to the electrical conductor 1720, has a high inductance, the inductor 1730 prevents flowing of an RF signal into the electrical conductor 1720 and thus may separate the RF coil 1710 from the electrical conductor 1720. Accordingly, the RF coil structure 1700 is entirely one RF coil, but is divided into the RF coil 1710 involved in an MR image signal and the electrical conductor 1720 for preventing mutual inductance coupling. A means for preventing mutual inductance coupling will be described in detail with reference to FIG. 19. It is preferable that at least one inductor 1730 is disposed between the capacitors 1711, 1712, 1713, and 1714 of the RF coil 1710. In other words, it is preferable that at least one inductor 1730 is disposed between the capacitor 1711 and the capacitor 1712 and thus connects the RF coil 1710 to the electrical conductor 1720.

The electrical conductor 1720 needs to be separated from the RF coil 1710 except for the connection with the RF coil 1710 via the inductor 1730. It is also preferable that the electrical conductor 1720 is formed of copper. It is also preferable that the electrical conductor 1720 has a loop structure.

Figure 18:
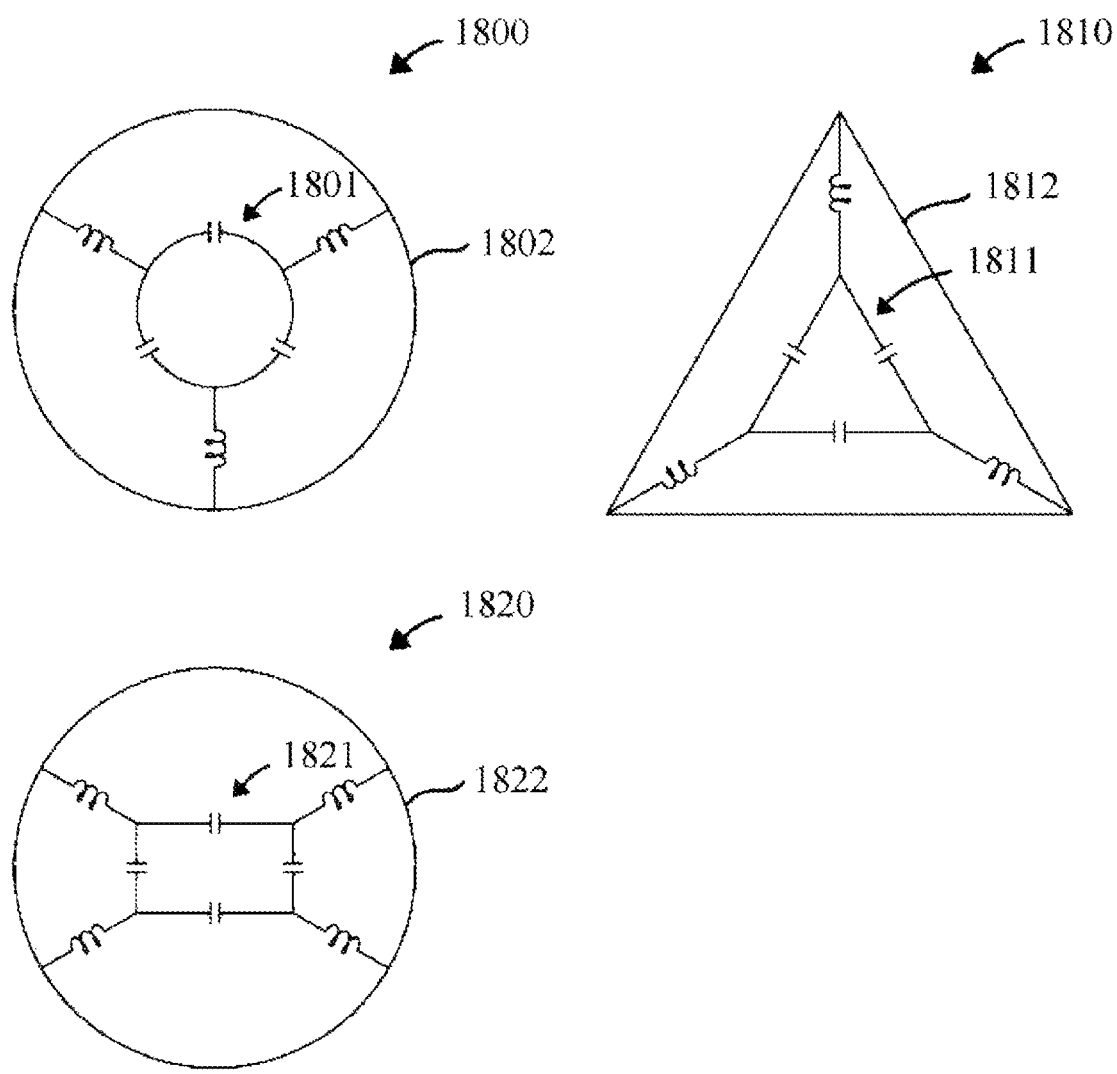
FIG. 18 illustrates another example of an RF coil structure according to the present disclosure.

FIG. 18 illustrates another example of an RF coil structure according to the present disclosure.

RF coils 1801, 1811, and 1821 and electrical conductors 1802, 1812, and 1822 that constitute RF coil structures 1800, 1810, and 1820 may have various shapes, such as a circle, a triangle, a quadrilateral, and an oval. As in the RF coil structure 1820, the RF coil 1821 is quadrilateral and the electrical conductor 1822 is circular. Thus, the shape of an RF coil may be different from that of an electrical conductor.

Figure 19:
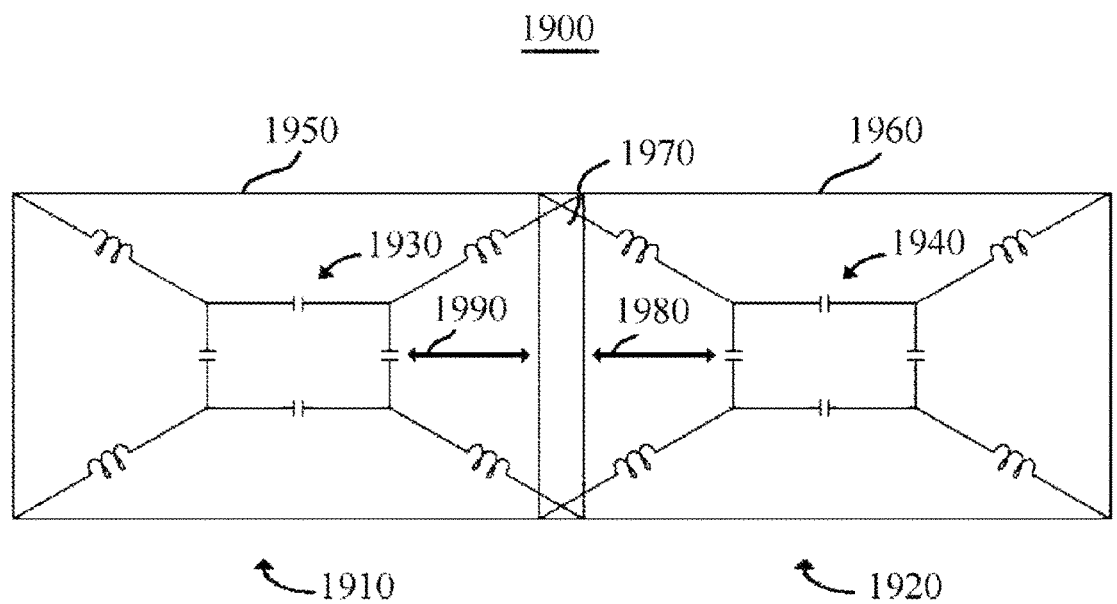
FIG. 19 illustrates an example of an RF coil device using an RF coil structure, according to the present disclosure.

FIG. 19 illustrates an example of an RF coil device 1900 using an RF coil structure, according to the present disclosure.

The RF coil device 1900 includes a first RF coil structure 1910 and a second RF coil structure 1920 adjacent to the first RF coil structure 1910. The RF coil structures 1910 and 1920 according to the present disclosure include RF coils 1930 and 1940, respectively, and electrical conductors 1950 and 1960 separated from the RF coils 1930 and 1940, respectively. The RF coil device 1900 includes an overlap area 1970 where the electrical conductors 1950 and 1960 of the adjacent first and second RF coil structures 1910 and 1920 overlap with each other. At the same time, the electrical conductor 1950 of the first RF coil structure 1910 and the RF coil 1940 of the second RF coil structure 1920 need to be apart by a certain interval 1980 from each other, and the electrical conductor 1960 of the second RF coil structure 1920 and the RF coil 1930 of the first RF coil structure 1910 need to be apart by a certain interval 1990 from each other. By arranging the first RF coil structure 1910 and the second RF coil structure 1920 as described above, even when the RF coil 1930 of the first RF coil structure 1910 and the RF coil 1940 of the second RF coil structure 1920 are adjacent to each other to the extent that they can receive an MR signal, the RF coil device 1970 having effectively-reduced mutual inductance coupling can be obtained. In other words, in the conventional art, when mutual inductance coupling is reduced by using an overlap area between RF coils adjacent enough to receive an MR signal, it is difficult to acquire a pure electric field derived from each of the adjacent RF coils. However, the present disclosure addresses this problem. In other words, since the overlap area 1970 according to the present disclosure is not an overlap area between the RF coils 1930 and 1940 respectively included in the RF coil structures 1910 and 1920, pure electric fields respectively derived from the RF coils 1930 and 1940 may be acquired.

Figure 20:
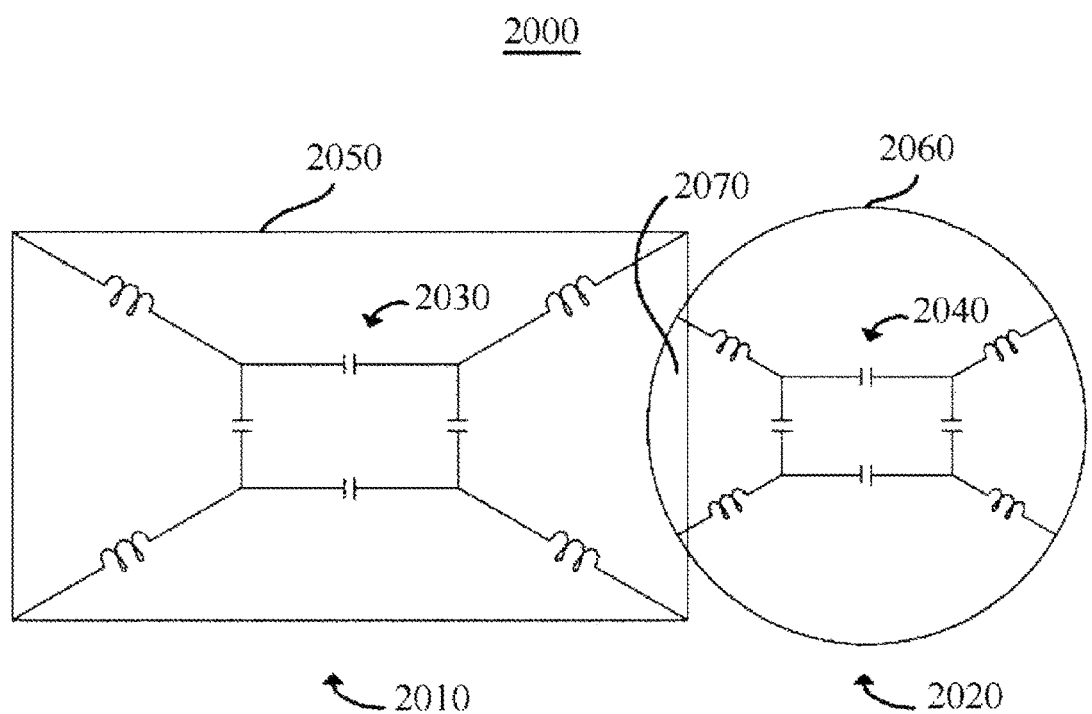
FIG. 20 illustrates another example of an RF coil device using an RF coil structure, according to the present disclosure.

FIG. 20 illustrates another example of an RF coil device 2000 using an RF coil structure, according to the present disclosure.

The RF coil device 2000 includes a first RF coil structure 2010 and a second RF coil structure 2020 adjacent to the first RF coil structure 2010. The first RF coil structure 2010 and the second RF coil structure 2020 include RF coils 2030 and 2040 and electrical conductors 2050 and 2060. Similar to FIG. 19, the RF coil device 2000 includes an overlap area 2070 defined by the electrical conductors 2050 and 2070 of the first and second RF coil structures 2010 and 2020. However, the electrical conductors 2050 and 2060 of the first and second RF coil structures 2010 and 2020 defining the overlap area 2070 have a quadrilateral shape and a circular shape, respectively, which are different shapes. Mutual inductance coupling occurs between adjacent RF coils because the shapes, resonant frequencies, or the like of the adjacent RF coils are the same as each other. Thus, by removing this cause of mutual inductance coupling, the mutual inductance coupling may be reduced. The RF coil structure according to the present disclosure may be entirely considered one RF coil. In other words, since the RF coil structures of the RF coil device 2000 of FIG. 7, which can be respectively entirely considered RF coils, include the electrical conductors 2050 and 2060 having different shapes and also have an overlap area between the RF coil structures, the RF coil device 2000 may more effectively reduce mutual inductance coupling than an RF coil device simply having an overlap area. Even when RF coils constituting an RF coil structure have different shapes although not shown in FIG. 20, the same effect may be anticipated.

Various embodiments according to the present disclosure will now be described as follows:

(33) an RF coil structure for use in an MRI system using a plurality of RF coil structures, the RF coil structure including an RF coil; an electrical conductor disposed around the RF coil to be apart from the RF coil; and an inductor that connects the RF coil to the electrical conductor;

(34) the RF coil structure in which the electrical conductor is formed of copper;

(35) the RF coil structure in which the electrical conductor has a loop structure;

(36) the RF coil structure in which the shapes of the RF coil and the electrical conductor are different;

(37) an RF coil device for use in an MRI system using a plurality of RF coil structures, the RF coil device including a first RF coil structure including an RF coil, an electrical conductor disposed around the RF coil to be apart from the RF coil, and an inductor that connects the RF coil to the electrical conductor; and a second RF coil structure disposed adjacent to the first RF coil structure and including an RF coil, an electrical conductor disposed around the RF coil to be apart from the RF coil, and an inductor that connects the RF coil to the electrical conductor, wherein the electrical conductor of the first RF coil structure overlaps the electrical conductor of the second RF coil structure;

(38) the RF coil device in which the electrical conductor of the first RF coil structure has a loop structure;

(39) the RF coil device in which the size of the overlap area is 10% of the loop area of the electrical conductor of the first RF coil structure;

(40) the RF coil device in which the electrical conductor of the first RF coil structure is apart by a certain interval from the RF coil of the second RF coil structure;

(41) the RF coil device in which the electrical conductor of the second RF coil structure is apart by a certain interval from the RF coil of the first RF coil structure;

(42) the RF coil device in which the electrical conductor of the first RF coil structure is apart by a certain interval from the RF coil of the second RF coil structure and simultaneously the electrical conductor of the second RF coil structure is apart by a certain interval from the RF coil of the first RF coil structure;

(43) the RF coil device in which the electrical conductor of the first RF coil structure and the electrical conductor of the second RF coil structure have different shapes;

(44) the RF coil device in which the electrical conductor of the first RF coil structure has a quadrilateral shape and the electrical conductor of the second RF coil structure has a circular shape;

(45) the RF coil device in which the RF coil of the first RF coil structure and the RF coil of the second RF coil structure have different shapes; and

(46) the RF coil device in which the RF coil of the first RF coil structure has a quadrilateral shape and the RF coil of the second RF coil structure has a circular shape.

According to the present disclosure, mutual inductance coupling occurring between adjacent RF coil structures may be efficiently reduced.

Figure 21:
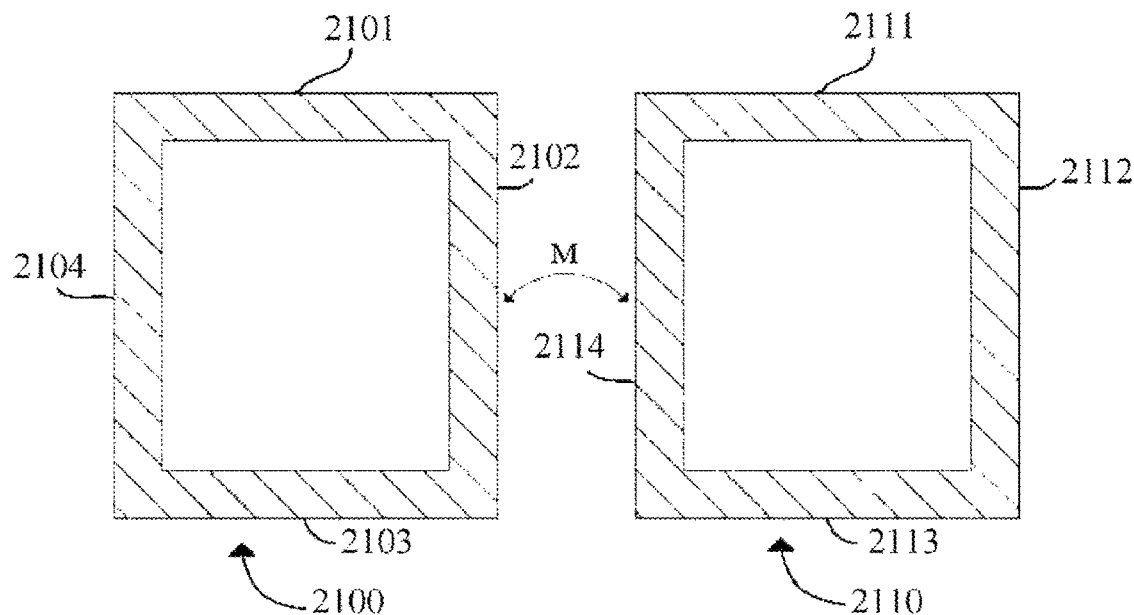
FIG. 21 illustrates an RF coil assembly in which RF coils are arranged adjacent to each other without a decoupling method being employed.

FIG. 21 illustrates an example of an RF coil assembly in which RF coils are arranged adjacent to each other without a decoupling method. As in the case of FIG. 2, an RF coil includes capacitors 7 and electrical conductors 8. In the case of FIG. 2, the electrical conductors 8 are marked by lines. However, electrical conductors that are actually used have sides like the electrical conductors 22 shown in FIG. 3. FIG. 21 does not illustrate capacitors that constitute an RF coil, for convenience of explanation, and only illustrates electrical conductors 2101, 2102, 2103, 2104, 2111, 2112, 2113, and 2114 corresponding to four sides of each quadrilateral and thus illustrate a first RF coil 2100 and a second RF coil 2110. FIG. 21 illustrates mutual inductance coupling M occurring between the first and second RF coils 2100 and 2110 adjacent to each other since no decoupling methods are used.

Figure 22:
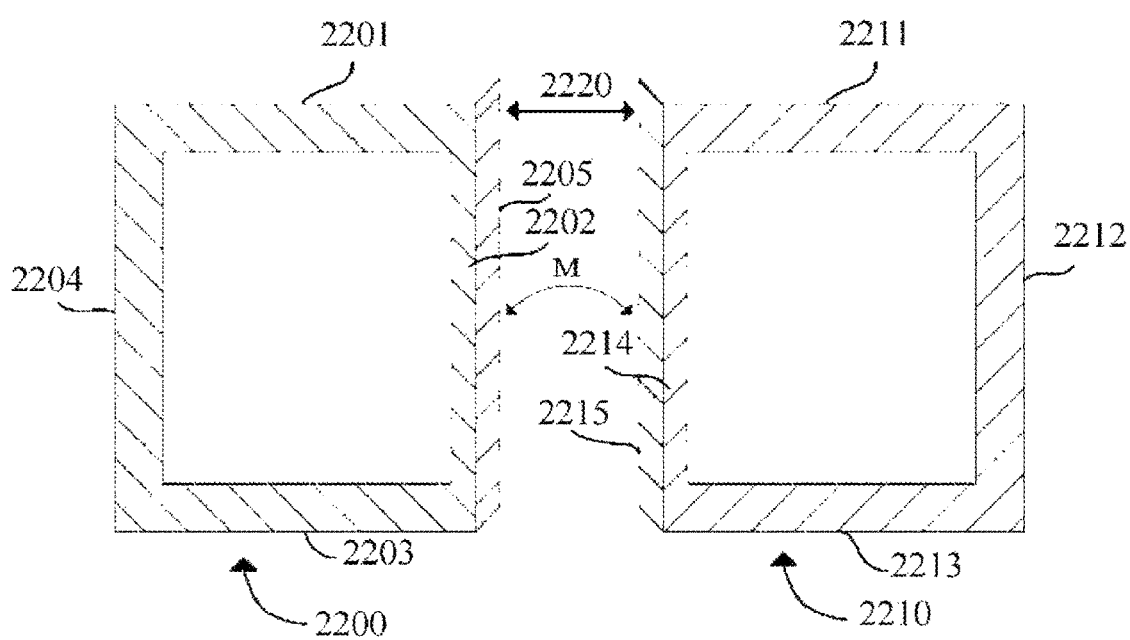
FIG. 22 illustrates an example of an RF coil assembly using an RF coil, according to the present disclosure.

FIG. 22 illustrates an example of an RF coil assembly using an RF coil according to the present disclosure. In the RF coil assembly according to the present example, a first RF coil 2200 and a second RF coil 2210 that are quadrilateral are arranged adjacent to each other, similar to FIG. 21. However, in contrast with FIG. 21, the first RF coil 2200 and the second RF coil 2210 include electrical conductors 2202 and 2214 and walls 2205 and 2215 integrally connected to the electrical conductors 2202 and 2214, as a decoupling method. Since the walls 2205 and 2215 are integrally connected to the electrical conductors 2202 and 2214, the walls 2205 and 2215 become portions of the RF coils. Since walls are portions of RF coils and reduce mutual inductance coupling without using a special decoupling circuit or an overlapping method, the walls may address a problem of a conventional decoupling method in that the decoupling method affects the resonant frequency of an RF coil. The electrical conductor 2202 of the first RF coil 2200 is adjacent to the electrical conductor 2214 of the second RF coil 2210. The walls 2205 and 2215 are built on the adjacent electrical conductors 2202 and 2214 to be integrally connected to the electrical conductors 2202 and 2214. Although the walls 2205 and 2215 are built on the first and second RF coils, respectively, in FIG. 22, a wall may be built on only one of the first RF coil and the second RF coil. As shown in FIG. 22, the two walls 2205 and 2215 may be built to face each other. In this case, the interval between the two walls is inversely proportional to the height of each wall. In other words, mutual inductance coupling between adjacent RF coils is small when the interval between two walls is large, and mutual inductance coupling between adjacent RF coils is large when the interval between two walls is small. Thus, preferably, as the interval between two walls of the adjacent RF coils increases, the height of each wall decreases, and, as the interval between two walls of the adjacent RF coils decreases, the height of each wall increases. Due to the walls 2205 and 2215 integrally connected to the electrical conductors 2202 and 2214, the mutual inductance coupling M between the adjacent first and second RF coils 2200 and 2210 is reduced.

Figure 23:
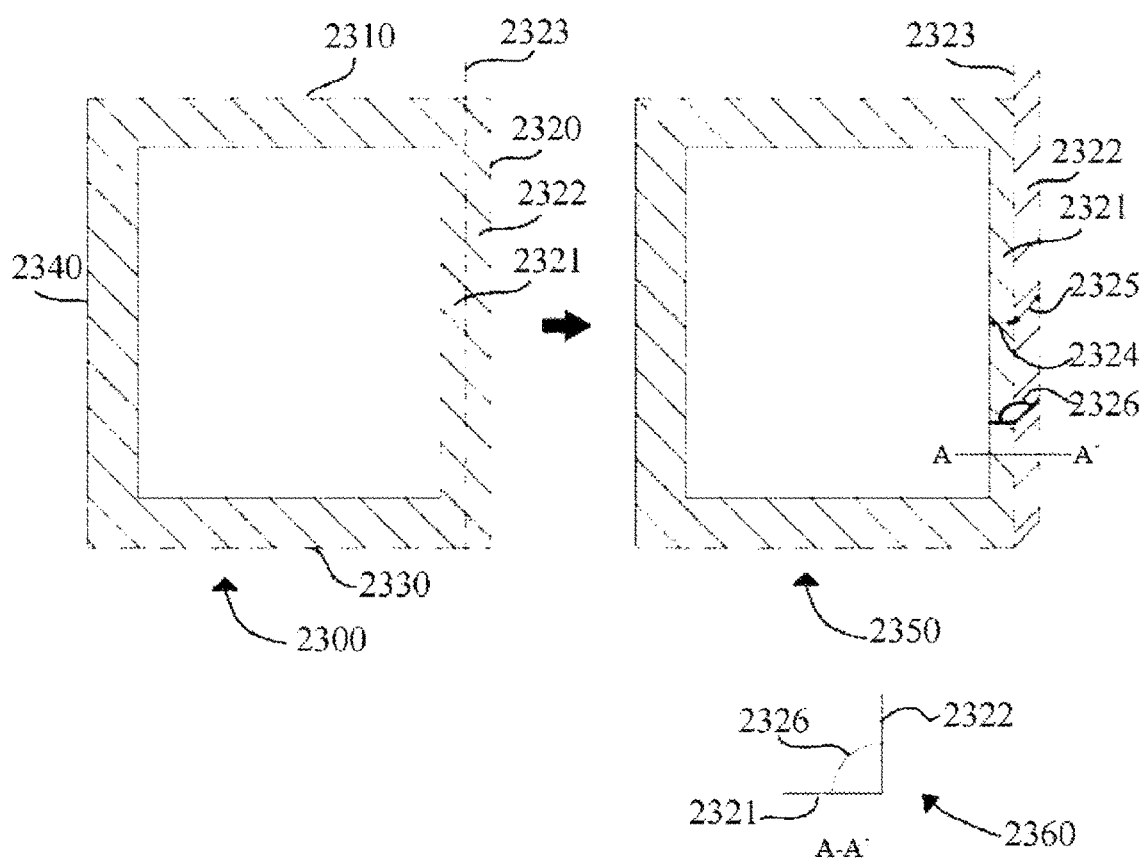
FIG. 23 illustrates an example of a method of manufacturing an RF coil, according to the present disclosure.

FIG. 23 illustrates an example of building a wall integrally connected to an electrical conductor, which is a decoupling method between adjacent RF coils according to the present disclosure.

FIG. 23 illustrates a method in which one of electrical conductors 2310, 2320, 2330, and 2340 of an RF coil 2300 before a wall is built is selected and then the wall is built on the selected electrical conductor. Walls may be built on the remaining electrical conductor according to the same method. First, the electrical conductor 2320 is divided into a first portion 2321 and a second portion 2322, based on a line 2323. The second portion 2322 is folded about the line 2323, and thus a wall is built. Accordingly, the second portion 2322 of the RF coil 2300 before a wall is built becomes a wall 2322 integrally connected to an electrical conductor 2321 in an RF coil 2350 after the wall is built. In this case, the wall 2322 and the electrical conductor 2321 are formed of the same material. The material used to form the wall 2322 and the electrical conductor 2321 is generally copper, but a result of plating copper with silver or gold may be used to improve conductivity of the wall 2322 and the electrical conductor 2321. It is preferable that a height 2325 of the wall is greater than a width 2324 of the electrical conductor, in order to prevent mutual inductance coupling.

In order to reduce mutual inductance coupling, the size of a dihedral angle 2326 formed by the wall 2322 and the electrical conductor 2321 is preferably 90 degrees.

It is also preferable that a cross-section (taken along line AA') formed by the wall 2322 and the electrical conductor 2321 has an L shape 2360.

Figure 24:
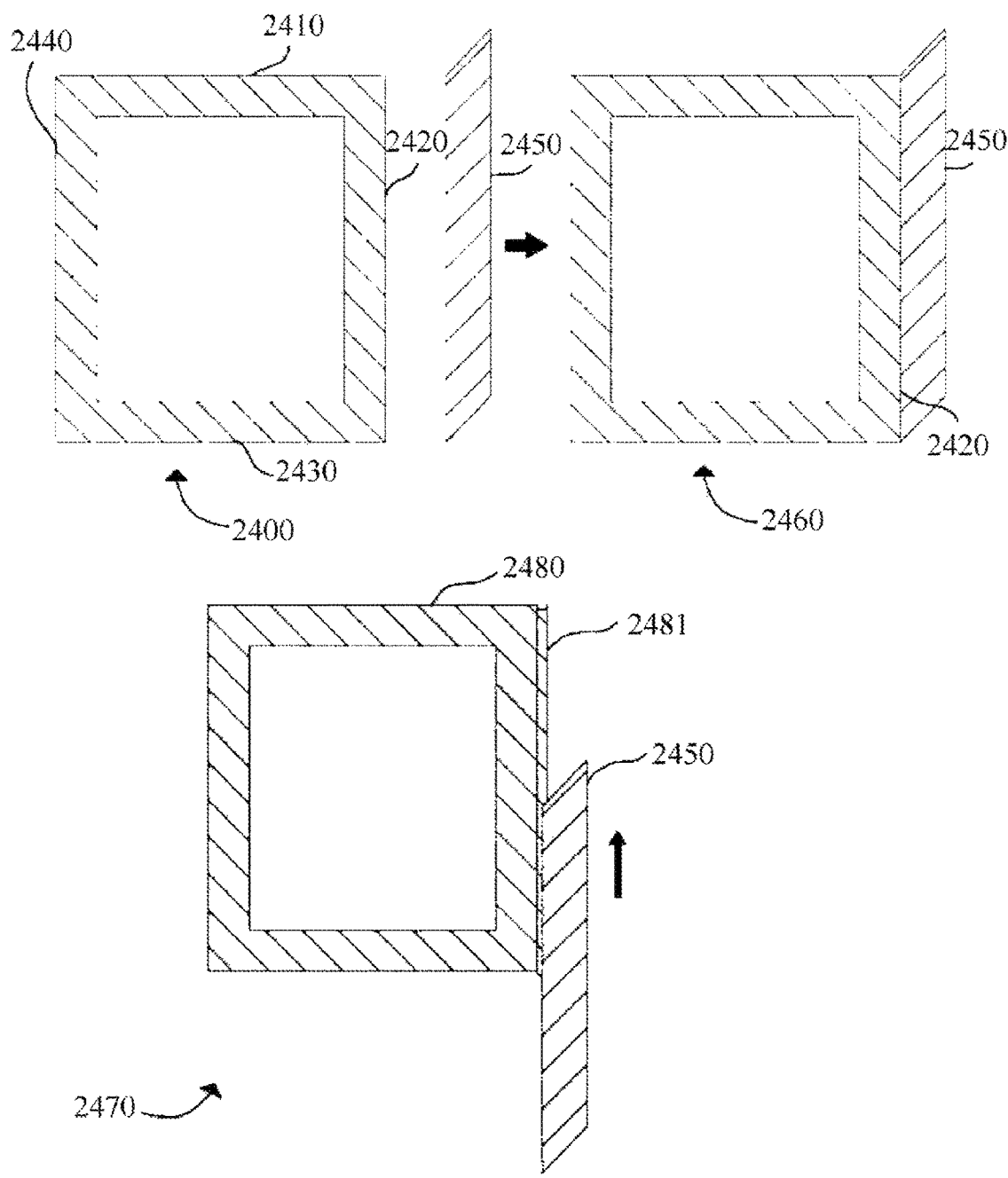
FIG. 24 illustrates another example of a method of manufacturing an RF coil, according to the present disclosure.

FIG. 24 illustrates another example of building a wall integrally connected to an electrical conductor, which is a decoupling method between adjacent RF coils according to the present disclosure.

FIG. 24 illustrates a method in which one of electrical conductors 2410, 2420, 2430, and 2440 of an RF coil 2400 before a wall is built is selected and then the wall is built on the selected electrical conductor. Walls may be built on the remaining electrical conductors according to the same method. First, a wall 2450 is prepared. The wall 2450 may be integrally connected to the electrical conductor 2420 to thereby make an RF coil 2460 having a built wall. The wall 2450 may be integrally connected to the electrical conductor 2420 by using an electrically-conductive adhesive, soldering, or a copper tape. Alternatively, a slit 2481 may be formed on an electrical conductor 2480 of an RF coil 2470 and thus the wall 2450 may be integrally connected to the electrical conductor 2480. In contrast with the above-described method of FIG. 23 in which a wall is built by folding an electrical conductor, the wall 2450 may be formed of a different material than the electrical conductor 2420. An RF coil may be formed by building a wall according to both the methods described with reference to FIGS. 23 and 24. For example, a wall may be built on the electrical conductor 2440 of FIG. 24 according to the method of FIG. 23, and simultaneously a wall may be built on the electrical conductor 2420 of FIG. 24 according to the method of FIG. 24.

Figure 25:
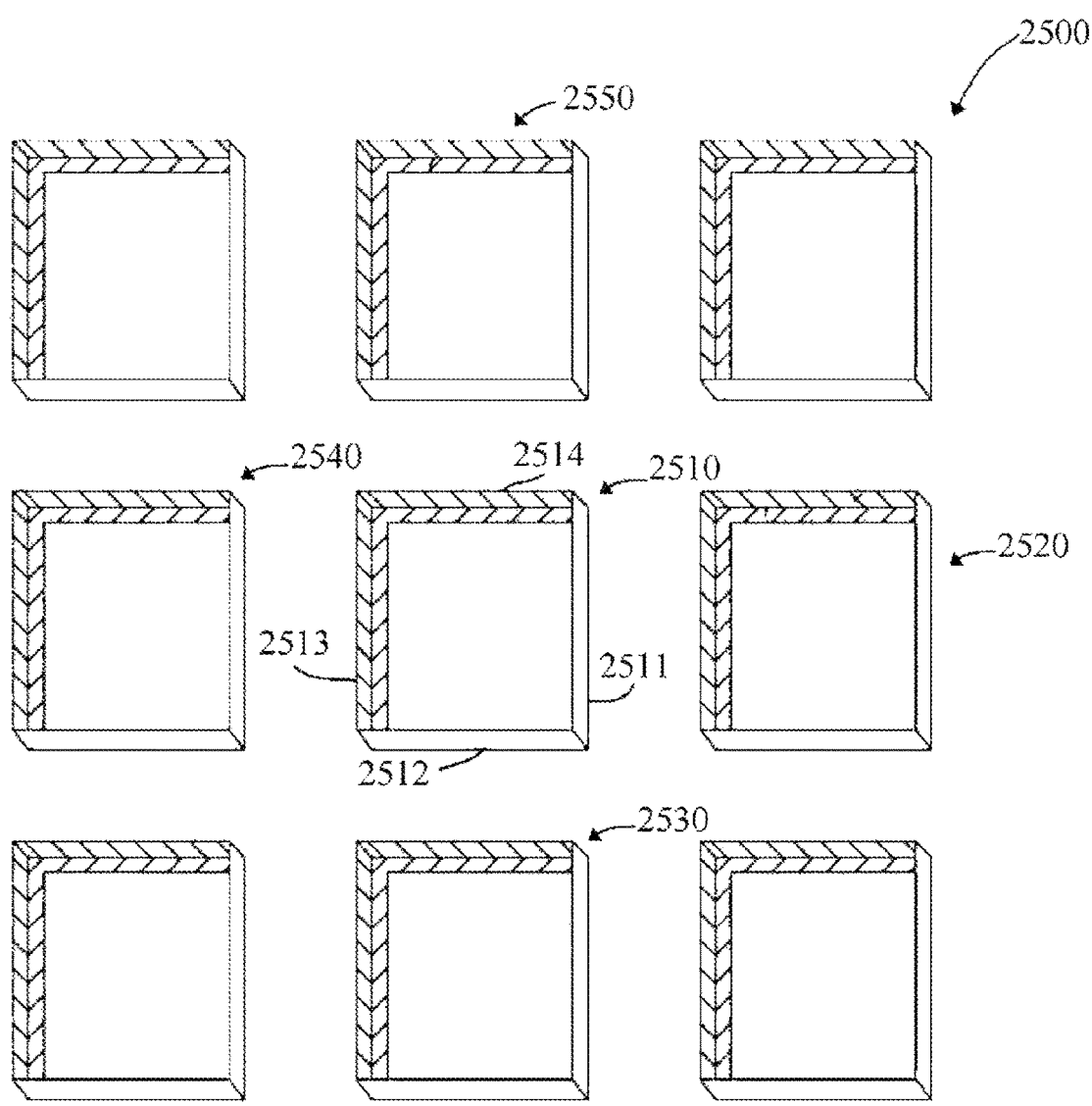
FIG. 25 illustrates another example of an RF coil assembly using an RF coil, according to the present disclosure.

FIG. 25 illustrates another example of an RF coil assembly using an RF coil according to the present disclosure.

FIG. 22 illustrates two RF coils arranged adjacent to each other. FIG. 25 illustrates an RF coil assembly 2500 including two or more RF coils arranged adjacent to each other. Each of the RF coils constituting the RF coil assembly 2500 includes a wall, which is a decoupling method according to the present disclosure. For example, an RF coil 2510 included in the RF coil assembly 2500 includes walls 2511, 2512, 2513, and 2514 in order to prevent mutual inductance coupling with RF coils 2520, 2530, 2540, and 2550 adjacent to the RF coil 2510.

Figure 26:
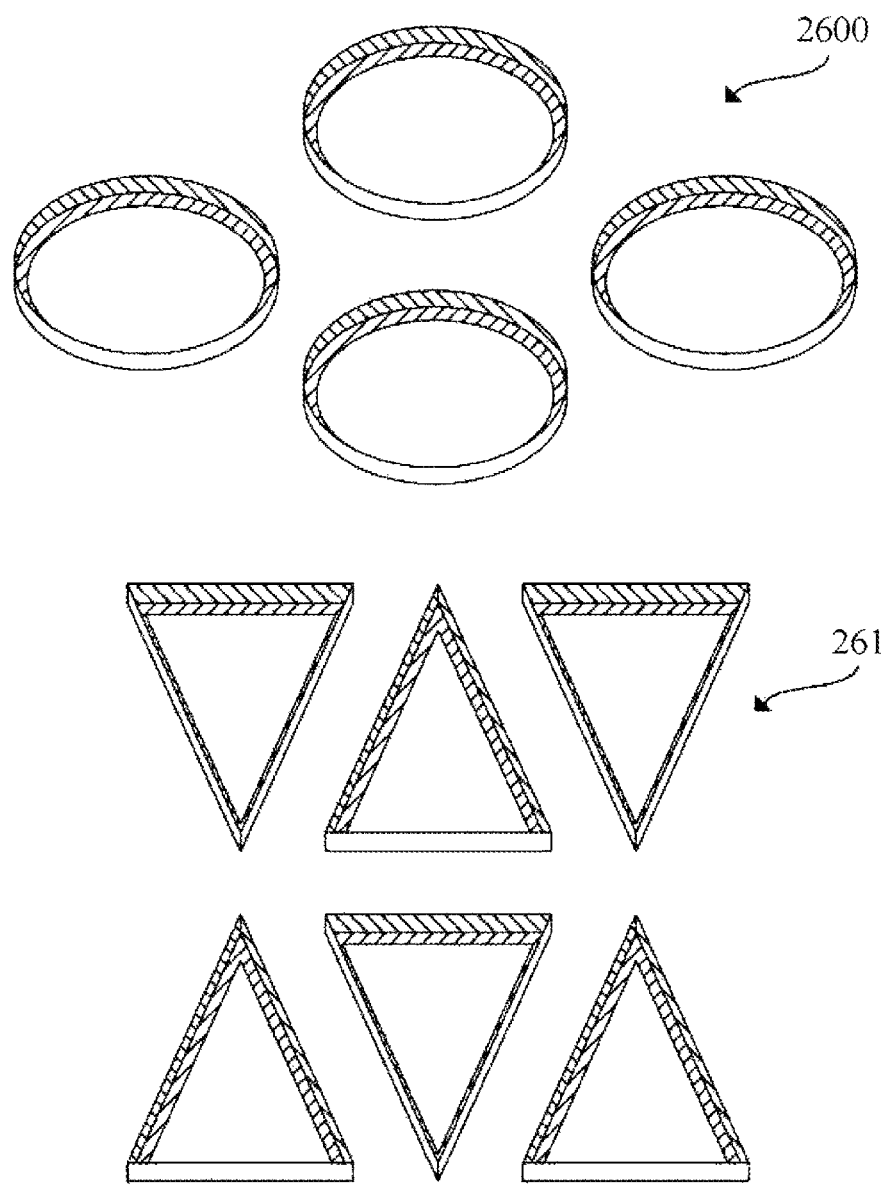
FIG. 26 illustrates another example of an RF coil assembly using various shapes of RF coils, according to the present disclosure.

FIG. 26 illustrates another example of an RF coil assembly using various shapes of RF coils according to the present disclosure.

Although a case where an RF coil has a quadrilateral shape has been described above, the present disclosure is not limited thereto. The present disclosure relates to an RF coil including a wall integrally connected to an electrical conductor. Thus, as shown in FIG. 26, RF coil assemblies 2600 and 2610 including various shapes of RF coils may be formed.

Figure 27:
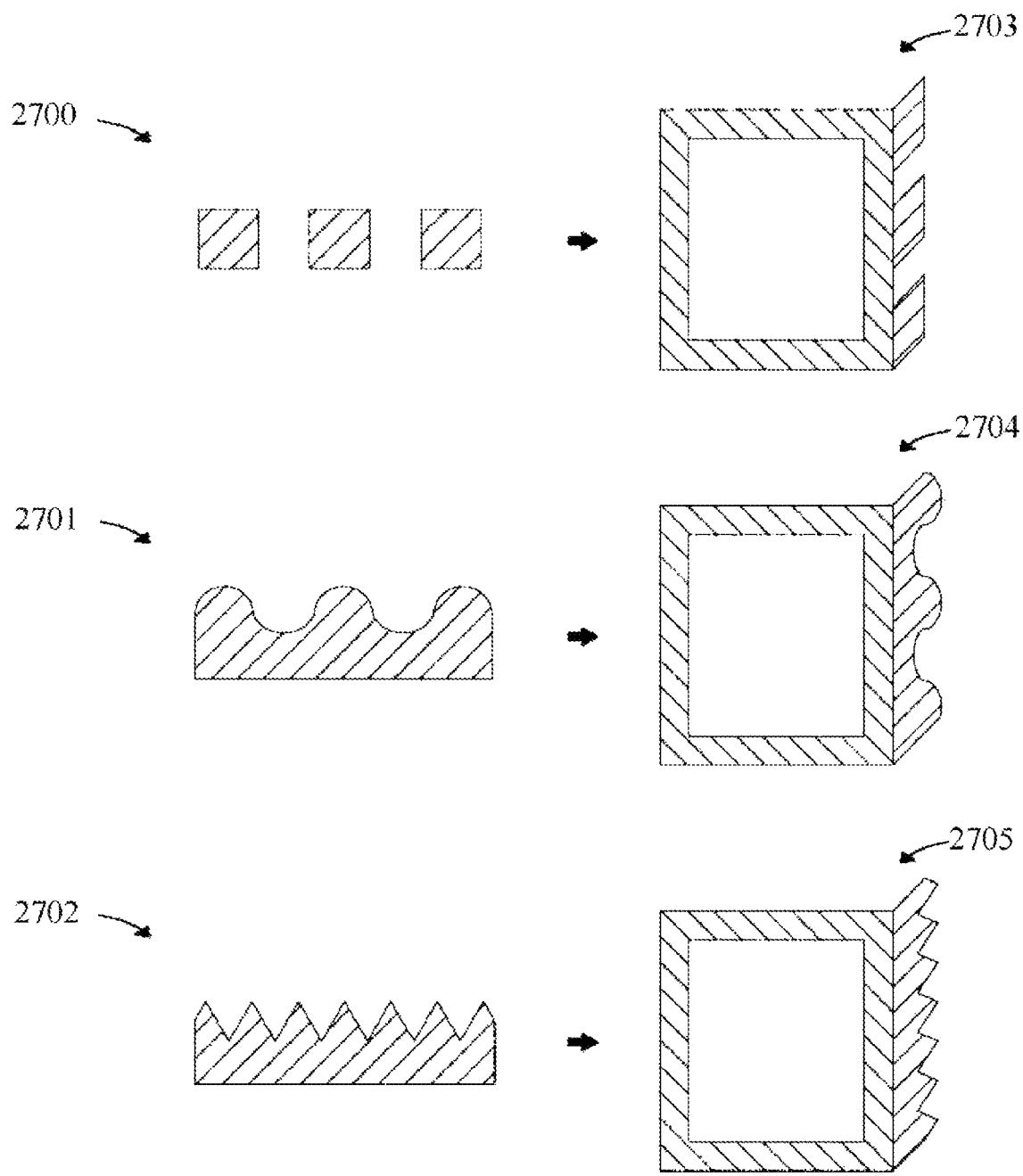
FIG. 27 illustrates an example of various shapes of walls of an RF coil according to the present disclosure.

FIG. 27 illustrates an example of various shapes of walls that can be included in an RF coil according to the present disclosure.

FIG. 27 shows an RF coil 2703 including a first shape wall 2700, an RF coil 2704 including a second shape wall 2701, and an RF coil 2705 including a third shape wall 2702. The first shape wall 2700 is a discontinuous wall, the second shape wall 2701 is a wavy wall, and the third shape wall 2702 is a saw-toothed wall. Other variously shaped walls may be considered. Adjacent RF coils having the same shape cause mutual inductance coupling. A wall is integrally formed with an electrical conductor and thus becomes a portion of an RF coil. Thus, when walls of adjacent RF coils that face each other have different shapes, the RF coils have different shapes and thus an effect of reducing mutual inductance coupling increases. For example, when the RF coil 2703 including the first shape wall 2700 and the RF coil 2704 including the second shape wall 2701 are arranged adjacent to each other and the two walls 2700 and 2701 face each other, mutual inductance coupling between the two adjacent coils 2703 and 2704 may be reduced more than when two opposite walls have the same shape. A case where two opposite walls have different heights is included in a case where two opposite walls have different shapes. When the first shape wall 2700 is used together with the RF coil having the slit used to assemble a wall described above with reference to FIG. 24, the number of first shape walls 2700 slid onto the slit is adjusted to thereby effectively reduce mutual inductance coupling. For example, when small mutual inductance coupling occurs between adjacent RF coils, about three first shape walls 2700 are slid onto the slit, but, when large mutual inductance coupling occurs between adjacent RF coils, about six first shape walls 2700 are slid onto the slit to thereby effectively reduce mutual inductance coupling.

Various embodiments according to the present disclosure will now be described as follows:

(47) an RF coil for use in an MRI apparatus using a plurality of RF coils, the RF coil including an electrical conductor; and a wall integrally formed with the electrical conductor in order to reduce mutual inductance coupling with at least one RF coil adjacent to the RF coil;

(48) the RF coil in which the electrical conductor and the wall are formed of different materials;

(49) the RF coil in which the electrical conductor and the wall are formed of the same material;

(50) the RF coil in which the electrical conductor and the wall are formed of copper;

(51) the RF coil in which a height of the wall is greater than a width of the electrical conductor;

(52) the RF coil in which a dihedral angle formed by the electrical conductor and the wall is 90 degrees;

(53) the RF coil in which a cross-section formed by the electrical conductor and the wall has an L shape;

(54) the RF coil in which the electrical conductor has a slit via which the electrical conductor may be integrally connected to the wall;

(55) an RF coil assembly for use in an MRI apparatus, the RF coil assembly including a first RF coil; a second RF coil; and a wall integrally formed with an electrical conductor in order to reduce mutual inductance coupling between the first and second RF coils, wherein at least one of the wall of the first RF coil and the wall of the second RF coil is positioned between the first RF coil and the second RF coil adjacent to each other;

(56) the RF coil assembly in which the wall of the first RF coil and the wall of the second RF coil face each other;

(57) the RF coil assembly in which an interval between facing walls is inversely proportional to a height of each wall;

(58) the RF coil assembly in which facing walls have different shapes;

(59) the RF coil assembly in which a height of at least one of the wall of the first RF coil and the wall of the second RF coil is greater than a width of an electrical conductor integrally connected with the at least one wall;

(60) the RF coil assembly in which a dihedral angle formed by the at least one of the wall of the first RF coil and the wall of the second RF coil and the electrical conductor integrally connected with the at least one wall is 90 degrees;

(61) the RF coil assembly in which the at least one of the wall of the first RF coil and the wall of the second RF coil and the electrical conductor integrally connected with the at least one wall are formed of the same material;

(62) the RF coil assembly in which an electrical conductor and a wall are formed of copper;

(63) the RF coil assembly in which the at least one of the wall of the first RF coil and the wall of the second RF coil and the electrical conductor integrally connected with the at least one wall are formed of different materials; and

(64) the RF coil assembly in which the electrical conductor has a slit in order to be integrally connected with the at least one of the wall of the first RF coil and the wall of the second RF coil.

According to the present disclosure, mutual inductance coupling occurring between adjacent RF coils may be reduced according to a simple method.

The invention claimed is:

1. A radiofrequency (RF) coil of a magnetic resonance imaging (MRI) system, the RF coil comprising:
   a main loop coil, having a polygonal shape, and comprising a plurality of first electrical conductors; and
   at least one auxiliary loop coil disposed outward from the plurality of first electrical conductors and comprising a plurality of second electrical conductors,
   wherein the main loop coil and the at least one auxiliary loop coil are connected in series with each other, and
   wherein the at least one auxiliary loop coil shares some of the electrical conductors of the main loop coil.

2. The RF coil of claim 1, wherein the at least one auxiliary loop coil is five or more in number.

3. The RF coil of claim 1, wherein the main loop coil comprises at least one electrical conductor that is parallel to a base magnetic field direction.

4. The RF coil of claim 1, wherein a shape of the at least one auxiliary loop coil is a convex shape.

5. The RF coil of claim 4, wherein the convex shape is a semicircle.

6. The RF coil of claim 1, wherein the main loop coil and the at least one auxiliary loop coil are on a same plane.

7. A radiofrequency (RF) coil assembly of a magnetic resonance imaging (MRI) system with a plurality of RF coils, the RF coil assembly comprising:
   a first RF coil comprising a first main loop coil having a polygonal shape, and comprising a first plurality of electrical conductors, and at least one first auxiliary loop coil arranged around the first main loop coil and comprising a second plurality of electrical conductors; and
   a second RF coil disposed adjacent to the first RF coil and comprising a second main loop coil having a polygonal shape, and comprising a third plurality of electrical conductors, and at least one second auxiliary loop coil arranged around the second main loop coil and comprising a fourth plurality of electrical conductors,
   wherein the at least one first auxiliary loop coil and the at least one second auxiliary loop coil overlap each other,
   wherein the at least one first auxiliary loop coil is connected in series with the first main loop coil and the at least one second auxiliary loop coil is connected in series with the second main loop coil, and
   wherein the at least one first auxiliary loop coil shares some of the electrical conductors of the first main loop coil.

8. The RF coil assembly of claim 7, wherein the at least one first auxiliary loop coil and the second main loop coil are spaced apart from each other by a certain distance and the at least one second auxiliary loop coil and the first main loop coil are spaced apart from each other by a certain distance.

9. The RF coil assembly of claim 7, wherein the number of the at least one first auxiliary loop coil is five or more, and the number of the at least one second auxiliary loop coil is five or more.

10. The RF coil assembly of claim 7, wherein at least one of the at least one first auxiliary loop coil and the at least one second auxiliary loop coil comprises at least one electrical connector that is parallel to a base magnetic field direction.

11. The RF coil assembly of claim 7, wherein at least one of the at least one first auxiliary loop coil and the at least one second auxiliary loop coil has a convex shape.

12. The RF coil assembly of claim 11, wherein the convex shape is a semicircle.

13. The RF coil assembly of claim 7, wherein the first main loop coil and the at least one first auxiliary loop coil are on a same plane.

14. The RF coil assembly of claim 13, wherein the second main loop coil and the at least one second auxiliary loop coil are on a same plane.

* * * * *